(12) United States Patent
Campbell et al.

(10) Patent No.: US 7,885,070 B2
(45) Date of Patent: Feb. 8, 2011

(54) APPARATUS AND METHOD FOR IMMERSION-COOLING OF AN ELECTRONIC SYSTEM UTILIZING COOLANT JET IMPINGEMENT AND COOLANT WASH FLOW

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 12/256,631

(22) Filed: Oct. 23, 2008

(65) Prior Publication Data
US 2010/0103614 A1 Apr. 29, 2010

(51) Int. Cl.
*H05K 7/20* (2006.01)
(52) U.S. Cl. ............ 361/699; 361/679.46; 361/679.53; 361/698; 165/80.4; 62/64; 62/259.2; 62/376
(58) Field of Classification Search ............ 361/679.46, 361/679.53, 699–701, 719–727, 732, 756, 361/831; 165/80.4, 80.5, 104.19, 104.21, 165/104.22, 104.33, 104.34, 185; 62/259.2, 62/64, 121, 171, 310, 376, 132; 257/713–719, 257/723–727; 174/15.1, 16.3, 252
See application file for complete search history.

(56) References Cited

U.S. PATENT DOCUMENTS

| 2,125,888 A | 8/1938 | Cordrey |
| 2,512,545 A | 6/1950 | Hazard |

(Continued)

FOREIGN PATENT DOCUMENTS

DE 101 12 389 A1 10/2002

(Continued)

OTHER PUBLICATIONS

RD 323064 A, Mar. 1991.*

(Continued)

*Primary Examiner*—Michael V Datskovskiy
(74) *Attorney, Agent, or Firm*—Geraldine Monteleone, Esq.; Kevin P. Radigan, Esq.; Heslin Rothenberg Farley & Mesiti P.C.

(57) ABSTRACT

Apparatus and method are provided for facilitating pumped, immersion-cooling of an electronic system having multiple different types of electronic components. The apparatus includes a container sized to receive the electronic system, a coolant inlet port and a coolant outlet port for facilitating ingress and egress of coolant through the container, and a manifold structure associated with the container. The manifold structure includes a coolant jet plenum with an inlet opening in fluid communication with the coolant inlet port, and one or more jet orifices in fluid communication with the coolant jet plenum. The jet orifices are positioned to facilitate cooling of at least one electronic component of the multiple different types of electronic components by jet impingement of coolant thereon when the electronic system is operatively positioned within the container for immersion-cooling thereof.

20 Claims, 14 Drawing Sheets

U.S. PATENT DOCUMENTS

| | | | |
|---|---|---|---|
| 2,548,325 A | 4/1951 | Smith | |
| 2,643,282 A | 6/1953 | Green | |
| 2,791,888 A | 5/1957 | Vani | |
| 3,109,485 A | 11/1963 | Fortier | |
| 3,143,592 A | 8/1964 | August | |
| 3,226,941 A | 1/1966 | Snelling | |
| 3,404,730 A | 10/1968 | Kurisu | |
| 3,476,175 A | 11/1969 | Plevyak | |
| 3,512,582 A | 5/1970 | Chu et al. | |
| 3,578,014 A | 5/1971 | Gachot | |
| 3,586,101 A | 6/1971 | Chu et al. | |
| 3,600,636 A | 8/1971 | Petersen | |
| 3,609,991 A | 10/1971 | Chu et al. | |
| 3,774,677 A | 11/1973 | Antonetti et al. | |
| 3,858,909 A | 1/1975 | Friedman | |
| 4,064,300 A | 12/1977 | Bhangu | |
| 4,108,242 A | 8/1978 | Searight et al. | |
| 4,201,195 A | 5/1980 | Sakhuja | |
| 4,302,793 A | 11/1981 | Rohner | |
| 4,430,866 A | 2/1984 | Willitts | |
| 4,590,538 A | 5/1986 | Cray, Jr. | |
| 4,622,946 A | 11/1986 | Hurley et al. | |
| 4,694,378 A | 9/1987 | Nakayama et al. | |
| 4,704,658 A | 11/1987 | Yokouchi et al. | |
| 4,741,385 A | 5/1988 | Bergles et al. | |
| 4,750,086 A | 6/1988 | Mittal | |
| 4,912,600 A * | 3/1990 | Jaeger et al. | 361/700 |
| 4,928,206 A | 5/1990 | Porter et al. | |
| 4,928,207 A | 5/1990 | Chrysler et al. | |
| 4,962,444 A | 10/1990 | Niggemann | |
| 5,021,924 A * | 6/1991 | Kieda et al. | 361/699 |
| 5,057,968 A | 10/1991 | Morrison | |
| 5,063,476 A | 11/1991 | Hamadah et al. | |
| 5,067,047 A * | 11/1991 | Azar | 361/691 |
| 5,126,919 A | 6/1992 | Yamamoto et al. | |
| 5,168,348 A * | 12/1992 | Chu et al. | 257/713 |
| 5,183,104 A | 2/1993 | Novotny | |
| 5,220,804 A * | 6/1993 | Tilton et al. | 62/64 |
| 5,270,572 A * | 12/1993 | Nakajima et al. | 257/714 |
| 5,305,184 A | 4/1994 | Andresen et al. | |
| 5,349,831 A * | 9/1994 | Daikoku et al. | 62/376 |
| 5,406,807 A | 4/1995 | Ashlwake et al. | |
| 5,414,592 A | 5/1995 | Stout et al. | |
| 5,458,185 A | 10/1995 | Mizuno | |
| 5,467,250 A | 11/1995 | Howard et al. | |
| 5,491,363 A | 2/1996 | Yoshikawa | |
| 5,675,473 A * | 10/1997 | McDunn et al. | 361/699 |
| 5,687,577 A * | 11/1997 | Ballard et al. | 62/64 |
| 5,718,117 A * | 2/1998 | McDunn et al. | 62/64 |
| 5,785,101 A | 7/1998 | Dennis | |
| 5,825,621 A | 10/1998 | Giannatto et al. | |
| 5,829,264 A | 11/1998 | Ishigaki et al. | |
| 5,854,092 A | 12/1998 | Root et al. | |
| 5,860,602 A * | 1/1999 | Tilton et al. | 239/548 |
| 5,864,466 A | 1/1999 | Remsburg | |
| 5,880,931 A * | 3/1999 | Tilton et al. | 361/690 |
| 5,907,473 A * | 5/1999 | Przilas et al. | 361/699 |
| 5,943,211 A * | 8/1999 | Havey et al. | 361/699 |
| 5,959,351 A * | 9/1999 | Sasaki et al. | 257/714 |
| 5,963,425 A | 10/1999 | Chrysler et al. | |
| 5,970,731 A | 10/1999 | Hare et al. | |
| 6,000,908 A | 12/1999 | Bunker | |
| 6,016,969 A * | 1/2000 | Tilton et al. | 239/1 |
| 6,019,167 A | 2/2000 | Bishop et al. | |
| 6,026,565 A | 2/2000 | Giannatto et al. | |
| 6,052,284 A | 4/2000 | Suga et al. | |
| 6,055,157 A | 4/2000 | Bartilson | |
| 6,139,361 A | 10/2000 | Przilas et al. | |
| 6,173,577 B1 | 1/2001 | Gold | |
| 6,193,905 B1 | 2/2001 | Yamada et al. | |
| 6,205,799 B1 * | 3/2001 | Patel et al. | 62/132 |
| 6,212,895 B1 | 4/2001 | Richardson | |
| 6,349,554 B2 * | 2/2002 | Patel et al. | 62/259.2 |
| 6,366,462 B1 | 4/2002 | Chu et al. | |
| 6,378,605 B1 | 4/2002 | Kutscher et al. | |
| 6,392,891 B1 | 5/2002 | Tzlil et al. | |
| 6,393,853 B1 | 5/2002 | Vukovic et al. | |
| 6,404,640 B1 | 6/2002 | Ishimine et al. | |
| 6,431,260 B1 | 8/2002 | Agonafer et al. | |
| 6,457,321 B1 * | 10/2002 | Patel et al. | 62/259.2 |
| 6,462,941 B1 | 10/2002 | Hulick et al. | |
| 6,519,151 B2 | 2/2003 | Chu et al. | |
| 6,536,510 B2 | 3/2003 | Khrustalev et al. | |
| 6,571,569 B1 * | 6/2003 | Rini et al. | 62/259.2 |
| 6,574,104 B2 | 6/2003 | Patel et al. | |
| 6,616,469 B2 | 9/2003 | Goodwin et al. | |
| 6,644,058 B2 * | 11/2003 | Bash et al. | 62/259.2 |
| 6,646,879 B2 | 11/2003 | Pautsch | |
| 6,807,056 B2 | 10/2004 | Kondo et al. | |
| 6,817,196 B2 * | 11/2004 | Malone et al. | 62/171 |
| 6,828,675 B2 | 12/2004 | Memory et al. | |
| 6,927,980 B2 | 8/2005 | Fukuda et al. | |
| 6,955,062 B2 * | 10/2005 | Tilton et al. | 62/259.2 |
| 6,973,801 B1 * | 12/2005 | Campbell et al. | 62/259.2 |
| 6,976,528 B1 * | 12/2005 | Tilton et al. | 165/104.33 |
| 7,011,143 B2 | 3/2006 | Corrado et al. | |
| 7,012,807 B2 | 3/2006 | Chu et al. | |
| 7,057,893 B2 | 6/2006 | Nicolai et al. | |
| 7,079,393 B2 | 7/2006 | Colgan et al. | |
| 7,088,585 B2 | 8/2006 | Chu et al. | |
| 7,104,078 B2 * | 9/2006 | Tilton | 62/121 |
| 7,106,590 B2 | 9/2006 | Chu et al. | |
| 7,134,289 B2 | 11/2006 | Patel et al. | |
| 7,143,605 B2 | 12/2006 | Rohrer et al. | |
| 7,187,549 B2 | 3/2007 | Teneketges et al. | |
| 7,191,954 B2 | 3/2007 | Kline | |
| 7,222,502 B2 | 5/2007 | Kobayashi et al. | |
| 7,233,491 B2 | 6/2007 | Faneuf et al. | |
| 7,251,139 B2 | 7/2007 | Bhattacharya et al. | |
| 7,252,100 B1 | 8/2007 | Downes et al. | |
| 7,258,161 B2 | 8/2007 | Cosley et al. | |
| 7,272,005 B2 * | 9/2007 | Campbell et al. | 361/699 |
| 7,285,851 B1 | 10/2007 | Cepeda-Rizo et al. | |
| 7,286,356 B2 | 10/2007 | Keenan et al. | |
| 7,295,440 B2 | 11/2007 | Ganev et al. | |
| 7,309,209 B2 | 12/2007 | Amiot et al. | |
| 7,349,213 B2 | 3/2008 | Campbell et al. | |
| 7,355,852 B2 | 4/2008 | Pfahnl | |
| 7,362,574 B2 | 4/2008 | Campbell et al. | |
| 7,365,973 B2 | 4/2008 | Rasmussen et al. | |
| 7,372,698 B1 * | 5/2008 | Tilton et al. | 361/701 |
| 7,375,962 B2 | 5/2008 | Campbell et al. | |
| 7,380,409 B2 | 6/2008 | Campbell et al. | |
| 7,385,810 B2 | 6/2008 | Chu et al. | |
| 7,392,660 B2 * | 7/2008 | Tilton et al. | 62/121 |
| 7,392,823 B2 | 7/2008 | Dong et al. | |
| 7,400,505 B2 | 7/2008 | Campbell et al. | |
| 7,408,776 B2 | 8/2008 | Campbell et al. | |
| 7,420,808 B2 | 9/2008 | Campbell et al. | |
| 7,428,151 B2 | 9/2008 | Sonnabend et al. | |
| 7,436,666 B1 | 10/2008 | Konshak | |
| 7,450,383 B1 | 11/2008 | Campbell et al. | |
| 7,450,384 B2 | 11/2008 | Tavassoli et al. | |
| 7,450,385 B1 | 11/2008 | Campbell et al. | |
| 7,466,549 B2 | 12/2008 | Dorrich et al. | |
| 7,477,513 B1 | 1/2009 | Cader et al. | |
| 7,477,514 B2 | 1/2009 | Campbell et al. | |
| 7,495,914 B2 * | 2/2009 | Tilton et al. | 361/699 |
| 7,531,142 B2 | 5/2009 | Huziwara et al. | |
| 7,559,207 B2 | 7/2009 | Knight et al. | |
| 7,602,608 B2 * | 10/2009 | Tilton et al. | 361/699 |
| 7,630,795 B2 | 12/2009 | Campbell et al. | |
| 7,639,499 B1 | 12/2009 | Campbell et al. | |
| 7,641,101 B2 | 1/2010 | Campbell et al. | |

| | | | |
|---|---|---|---|
| 7,654,100 B2 * | 2/2010 | Rini et al. ................... | 62/259.2 |
| 7,660,109 B2 | 2/2010 | Iyengar et al. | |
| 7,724,524 B1 | 5/2010 | Campbell et al. | |
| 2002/0062945 A1 | 5/2002 | Hocker et al. | |
| 2003/0230401 A1 | 12/2003 | Pfister et al. | |
| 2004/0057211 A1 | 3/2004 | Kondo et al. | |
| 2005/0207116 A1 | 9/2005 | Yatskov et al. | |
| 2005/0244280 A1 | 11/2005 | Malone et al. | |
| 2005/0254214 A1 | 11/2005 | Salmon | |
| 2006/0126296 A1 * | 6/2006 | Campbell et al. ........... | 361/700 |
| 2006/0162365 A1 | 7/2006 | Hoang et al. | |
| 2006/0180300 A1 | 8/2006 | Lenehan et al. | |
| 2007/0025081 A1 | 2/2007 | Berlin et al. | |
| 2007/0035937 A1 | 2/2007 | Colbert et al. | |
| 2007/0121295 A1 | 5/2007 | Campbell et al. | |
| 2007/0159797 A1 | 7/2007 | Teneketges et al. | |
| 2007/0193300 A1 | 8/2007 | Tilton et al. | |
| 2007/0199204 A1 * | 8/2007 | Knight et al. ................. | 34/428 |
| 2007/0199340 A1 | 8/2007 | Knight et al. | |
| 2007/0201210 A1 | 8/2007 | Chow et al. | |
| 2007/0291452 A1 | 12/2007 | Gilliland et al. | |
| 2007/0295480 A1 | 12/2007 | Campbell et al. | |
| 2007/0297136 A1 | 12/2007 | Konshak | |
| 2008/0002363 A1 | 1/2008 | Campbell et al. | |
| 2008/0018212 A1 | 1/2008 | Spearing et al. | |
| 2008/0024991 A1 | 1/2008 | Colbert et al. | |
| 2008/0062639 A1 | 3/2008 | Campbell et al. | |
| 2008/0123297 A1 * | 5/2008 | Tilton et al. ................. | 361/700 |
| 2008/0158818 A1 | 7/2008 | Clidaras et al. | |
| 2008/0196868 A1 | 8/2008 | Attlesey et al. | |
| 2008/0209931 A1 | 9/2008 | Stevens | |
| 2008/0225478 A1 | 9/2008 | Goettert et al. | |
| 2009/0080173 A1 | 3/2009 | Schmidt et al. | |
| 2009/0086428 A1 | 4/2009 | Campbell et al. | |
| 2009/0086432 A1 | 4/2009 | Campbell et al. | |
| 2009/0126810 A1 | 5/2009 | Campbell et al. | |
| 2009/0126909 A1 | 5/2009 | Ellsworth, Jr. et al. | |
| 2009/0133866 A1 | 5/2009 | Campbell et al. | |
| 2009/0238235 A1 | 9/2009 | Campbell et al. | |
| 2009/0260777 A1 | 10/2009 | Attlesey | |
| 2009/0268404 A1 | 10/2009 | Chu et al. | |
| 2009/0314467 A1 | 12/2009 | Campbell et al. | |
| 2009/0316360 A1 | 12/2009 | Campbell et al. | |
| 2010/0101759 A1 | 4/2010 | Campbell et al. | |
| 2010/0101765 A1 | 4/2010 | Campbell et al. | |
| 2010/0103618 A1 | 4/2010 | Campbell et al. | |
| 2010/0103620 A1 | 4/2010 | Campbell et al. | |

FOREIGN PATENT DOCUMENTS

| | | |
|---|---|---|
| JP | 8-254512 A | 10/1996 |

OTHER PUBLICATIONS

Campbell et al., "Liquid-Based Cooling Apparatus for an Electronics Rack", U.S. Appl. No. 11/763,678, filed Jun. 15, 2007.

Iyengar et al., "Apparatus and Method for Facilitating Cooling of an Electronics System", U.S. Appl. No. 11/957,619, filed Dec. 17, 2007.

Goettert et al., "Heat Exchange System for Blade Server Systems and Method", U.S. Appl. No. 12/038,025, filed Feb. 27, 2008.

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chee, B., "Supermicro Water Cooled Blades", Info World, Geeks in Paradise, (Mar. 5, 2008), http://weblog.infoworld.com/geeks/archives/2008/03.

Campbell et al., "Liquid Cooling Apparatus and Method of Facilitating Cooling of an Electronic System", U.S. Appl. No. 12/168,259, filed Jul. 7, 2008.

"Notification of Transmittal of the International Search Report and the Written Opinion of the International Searching Authority, or the Declaration", International Application No. PCT/EP2009/060792, dated Dec. 23, 2009.

Hwang, U., "Heat Exchanger for Vapor Condensation by Dropwise Technique", IBM Technical Disclosure Bulletin, Publication No. IPCOM000089717D (Dec. 1, 1977).

Oktay et al., "Subcooled Flow Boiling with Flow Pattern Control", IBM Technical Disclosure Bulletin, Publication No. IPCOM000067827D (Oct. 1, 1979).

Hwang et al., "Evaporation Cooling Module", IBM Technical Disclosure Bulletin, Publication No. IPCOM000066472D (Mar. 1, 1979).

D. Delia et al., "System Cooling Design for the Water-Cooled IBM Enterprise System/900 Processors", IBM Journal of Research and Development, vol. 36, No. 4 pp. 791-803 (Jul. 1992).

Miyahara, M., "Small Fans for Cooling Small Electronic Devices" Electronics Cooling Magazine, online article retrieved from http://electronics-cooling.com/html/2009_may_techbrief.php (Aug. 31, 2009).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

Zamanabadi et al., "Hybrid Control Challenges in Refrigeration Systems", Danfoss A/A, Denmark, Advanced Engineering - Refrigeration and Air Conditioning, EECI (2007).

Campbell et al., "Condenser Fin Structures Facilitating Vapor Condensation Cooling of Coolant", U.S. Appl. No. 12/491,286, filed on Jun. 25, 2009.

Campbell et al., "Condenser Structures with Fin Cavities Facilitating Vapor Condensation Cooling of Coolant", U.S. Appl. No. 12/491,287, filed on Jun. 25, 2009.

Campbell et al. "Apparatus and Method for Adjusting Coolant Flow Resistance Through Liquid-Cooled Electronics Rack(s)", U.S. Appl. No. 12/566,040, filed on Sep. 9, 2009.

Campbell et al., "Apparatus and Method with Forced Coolant Vapor Movement for Facilitating Two-Phase Cooling of an Electric Device", U.S. Appl. No. 12/565,175, filed on Sep. 23, 2009.

Campbell et al., "Liquid-Cooled Electronics Apparatus and Methods of Fabrication", U.S. Appl. No. 12/556,081, filed on Sep. 24, 2009.

Campbell et al., "Compliant Conduction Rail Assembly and Method Facilitating Cooling of an Electronics Structure", U.S. Appl. No. 12/570,215, filed on Sep. 30, 2009.

Campbell et al., "Cooled Electronic Module with Pump-Enhanced, Dielectric Fluid Immersion-Cooling", U.S. Appl. No. 12/491,281, filed on Jun. 25, 2009.

Campbell et al., "System and Method for Standby Mode Cooling of a Liquid-Cooled Electronics Rack", U.S. Appl. No. 12/567,954, filed on Sep. 28, 2009.

Campbell et al., "Cooling System and Method Minimizing Power Consumption in Cooling Liquid-Cooled Electronics Racks", U.S. Appl. No. 12/556,066, filed on Sep. 9, 2009.

Campbell et al., "Liquid-Cooled Electronics Rack with Immersion-Cooled Electronic Subsystems and Vertically-Mounted, Vapor-Condensing Unit", U.S. Appl. No. 12/825,745, filed on Jun. 29, 2010.

Campbell et al., "Immersion-Cooling Apparatus and Method for an Electronic Subsystem of an Electronics Rack", U.S. Appl. No. 12/825,756, filed on Jun. 29, 2010.

Campbell et al., "Interleaved, Immersion-Cooling Apparatus and Method for an Electronic Subsystem of an Electronics Rack", U.S. Appl. No. 12/825,761, filed on Jun. 29, 2010.

Campbell et al., "Interleaved, Immersion-Cooling Apparatuses and Methods for Cooling Electronic Subsystems", U.S. Appl. No. 12/825,776, filed on Jun. 29, 2010.

Campbell et al., "Liquid-Cooled Electronics Rack with Immersion-Cooled Electronic Subsystems", U.S. Appl. No. 12/825,781, filed on Jun. 29, 2010.

Office Action for U.S. Appl. No. 12/256,628 (U.S. Patent Publication No. 2010/0103618 A1), dated Aug. 5, 2010.

Office Action for U.S. Appl. No. 12/256,605 (U.S. Patent Publication No. 2010/0103620 A1), dated Aug. 10, 2010.
Office Action for U.S. Appl. No. 12/256,618 (U.S. Patent Publication No. 2010/101759 A1), dated Aug. 30, 2010.

Office Action for U.S. Appl. No. 12/256,623 (U.S. Patent Publication No. 2010/0101765 A1), dated Nov. 5, 2010.

* cited by examiner

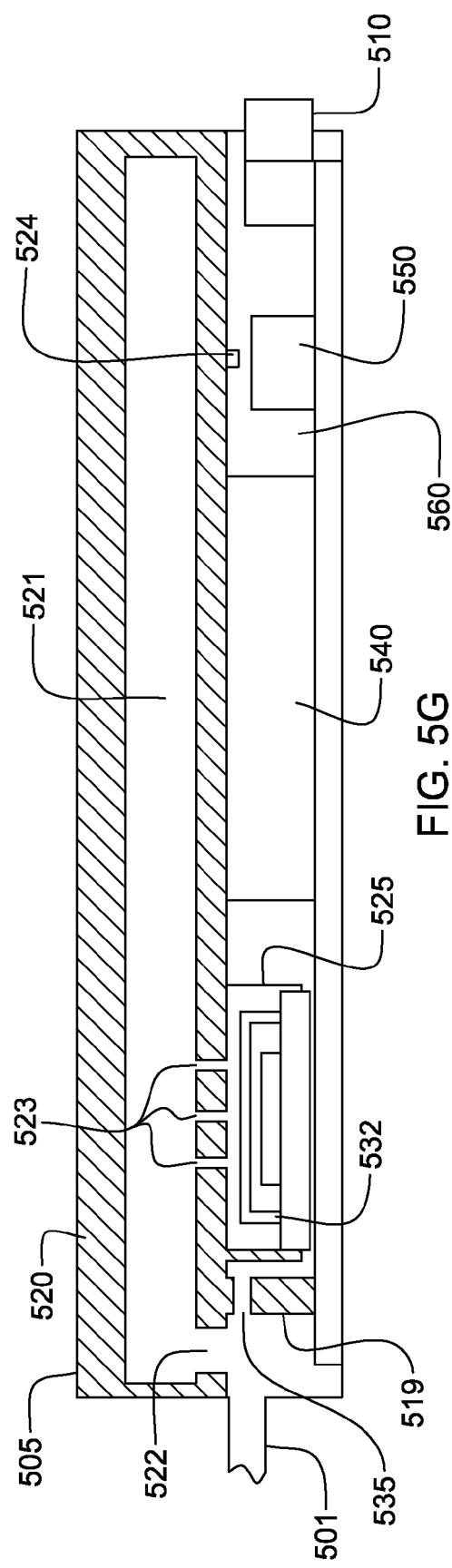

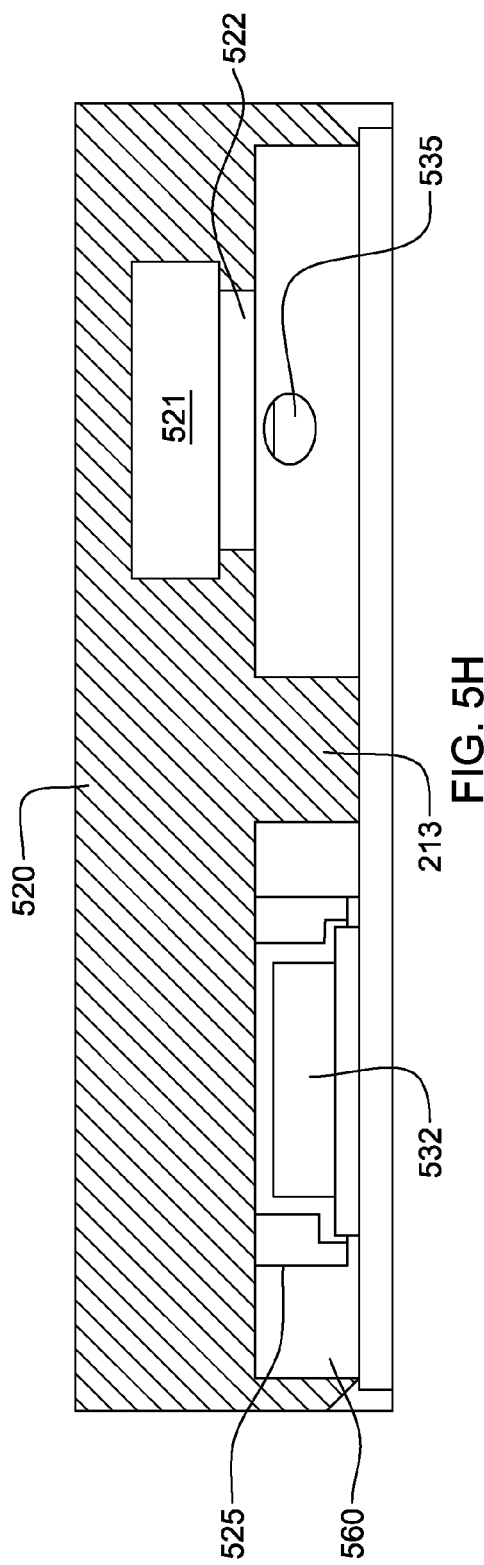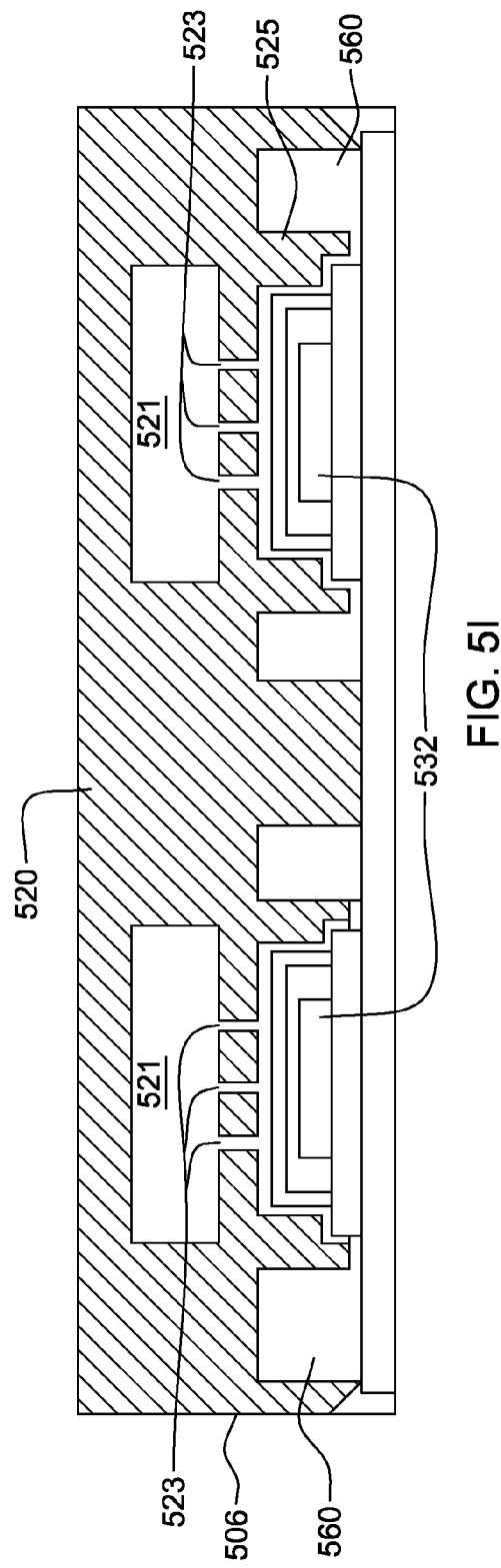

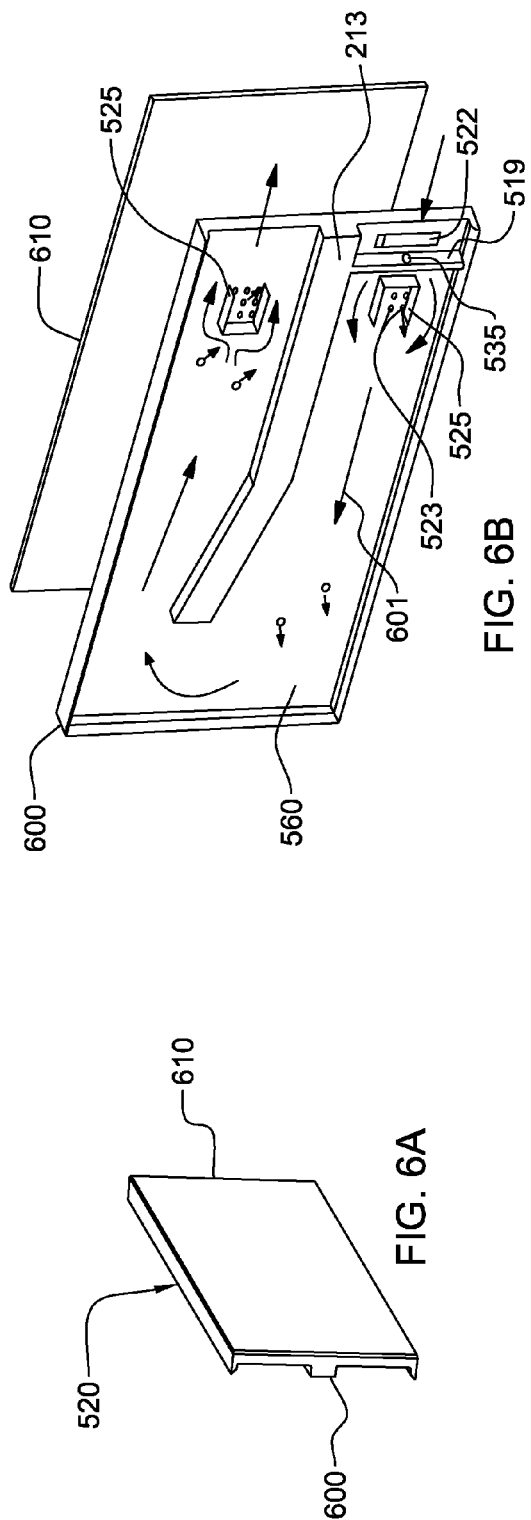

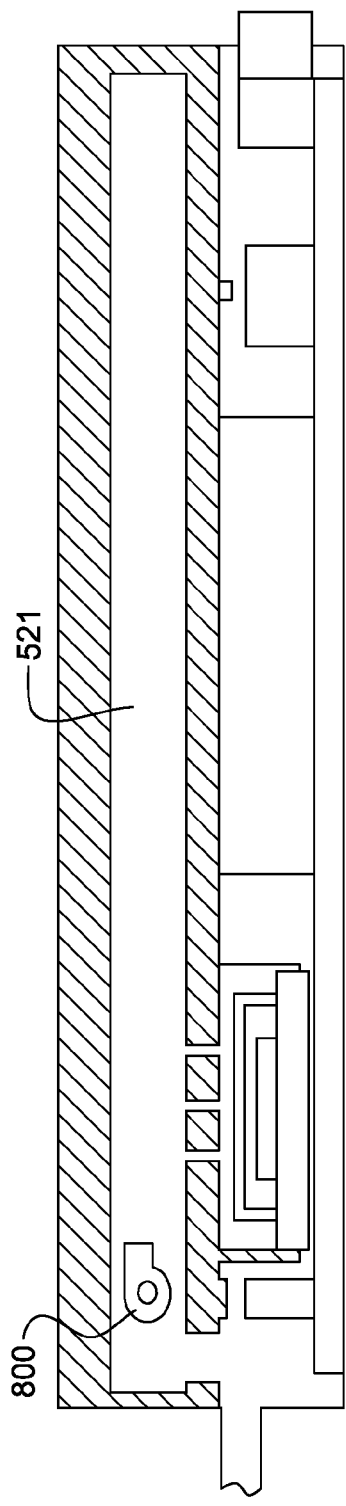
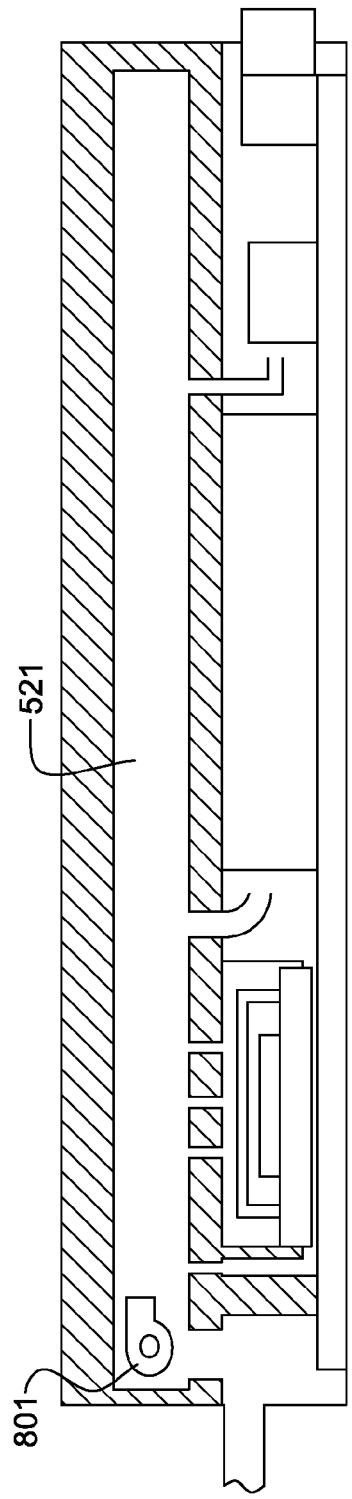
FIG. 8A
FIG. 8B

APPARATUS AND METHOD FOR IMMERSION-COOLING OF AN ELECTRONIC SYSTEM UTILIZING COOLANT JET IMPINGEMENT AND COOLANT WASH FLOW

TECHNICAL FIELD

The present invention relates to apparatuses and methods for facilitating cooling of an electronics system, such as a blade of a multi-blade center system, and more particularly, to apparatuses and methods for facilitating pumped immersion-cooling of an electronic system employing both coolant jet impingement and coolant wash flow in cooling different electronic components of the electronic system.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air that is exhausted into the computer center.

In many server applications, processors along with their associated electronics (e.g., memory, disc drives, power supplies, etc.) are packaged in removable drawer or blade configurations disposed within a housing. Typically, the components are cooled by air moving in parallel air flow paths, usually front-to-back, impelled by one or more air-moving devices (e.g., fans or blowers). In some cases, it may be possible to handle increased power dissipation within a single drawer or blade chassis by providing greater air flow, through the use of a more powerful air-moving device, or by increasing the rotational speed (i.e., RPMs) of an existing air-moving device. However, this approach is becoming problematic at the system level.

The sensible heat load carried by air exiting the electronics rack is stressing the ability of room air-conditioning to effectively handle the load. This is especially true for large installations with "server farms" or large banks of computer racks close together. In such installations, liquid cooling of selected components is an attractive technology to manage the higher heat fluxes. The liquid coolant absorbs the heat dissipated by selected components/modules in an efficient manner. Typically, the absorbed heat is ultimately transferred from the liquid to an outside environment, whether air or liquid-cooled.

SUMMARY OF THE INVENTION

The shortcomings of the prior art are overcome and additional advantages are provided through the provision of an apparatus for facilitating cooling of an electronic system. The apparatus includes a container sized to receive an electronic system therein, wherein the electronic system includes multiple different types of electronic components to be cooled. The apparatus further includes a coolant inlet port and a coolant outlet port associated with the container and a manifold structure. The coolant inlet and outlet ports facilitate ingress and egress of coolant through the container, wherein when the electronic system is operatively disposed within the container and coolant flows therethrough, the multiple different types of electronic components of the electronic system are immersion-cooled by the coolant. The manifold structure includes a coolant jet plenum with an inlet opening in fluid communication with the coolant inlet port for receiving at least a portion of the coolant ingressing therethrough, and at least one jet orifice in fluid communication with the coolant jet plenum. The at least one jet orifice is positioned to facilitate cooling of at least one electronic component of the multiple different types of electronic components by jet impingement of coolant thereon when the electronic system is operatively positioned within the container and coolant flows therethrough.

In another aspect, a cooled electronics rack is provided. The cooled electronics rack includes an electronics rack, at least one electronic system chassis, at least one electronic system, and an apparatus for facilitating cooling of the at least one electronic system. The electronics rack at least partially surrounds and supports the at least one electronic system chassis, which includes the at least one electronic system, and each electronic system includes multiple different types of electronic components to be cooled. Each apparatus includes a container sized to accommodate a respective electronic system, and a coolant inlet port and a coolant outlet port associated with the container for facilitating ingress and egress of coolant through the container, wherein when coolant flows through the container, the multiple different types of electronic components thereof are immersion-cooled by the coolant. Each apparatus further comprises a manifold structure disposed within the container. The manifold structure includes a coolant jet plenum with an inlet opening in fluid communication with the coolant inlet port for receiving at least a portion of the coolant ingressing therethrough, and at least one jet orifice in fluid communication with the coolant jet plenum. The at least one jet orifice is positioned to facilitate cooling of at least one electronic component of the multiple different types of electronic components by jet impingement of coolant thereon when coolant flows through the container.

In a further aspect, a method is provided for facilitating cooling of an electronic system. The method includes: providing a container sized to receive an electronic system therein, and a coolant inlet port and a coolant outlet port associated with the container for facilitating ingress and egress of coolant through the container, respectively, the electronic system comprising multiple different types of electronic components to be immersion-cooled; and providing a manifold structure disposed within the container, the manifold structure comprising a coolant jet plenum with an inlet opening in fluid communication with the coolant inlet port for receiving at least a portion of the coolant ingressing therethrough, and a plurality of jet orifices in fluid communication with the coolant jet plenum, the plurality of jet orifices being positioned to facilitate cooling of at least one electronic component of the multiple different types of electronic components by jet impingement of coolant thereon when the electronic system is operatively positioned within the container.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5G is a cross-sectional elevational view of the assembly of FIGS. 5A-5F, taken along line 5G-5G of FIG. 5F, in accordance with an aspect of the present invention;

FIG. 5H is a cross-sectional elevational view of the assembly of FIGS. 5A-5G, taken along line 5H-5H of FIG. 5F, in accordance with an aspect of the present invention;

FIG. 5I is a cross-sectional elevational view of the assembly of FIGS. 5A-5H, taken along line 5I-5I of FIG. 5F, in accordance with an aspect of the present invention;

FIG. 6A is an isometric view of one embodiment of a manifold structure for use in an assembly such as depicted in FIGS. 5A-5K, in accordance with an aspect of the present invention;

FIG. 6B is a partially exploded isometric view of the manifold structure of FIG. 6A, in accordance with an aspect of the present invention;

FIG. 6C is an isometric view of a portion of the manifold structure of FIGS. 6A & 6B, in accordance with an aspect of the present invention;

FIG. 8A is a cross-sectional elevational view of an alternate embodiment of an assembly comprising a container, a manifold structure and an immersion-cooled electronic system, in accordance with an aspect of the present invention; and FIG. 8B is a cross-sectional elevational view of another alternate embodiment of an assembly comprising a container, a manifold structure and an immersion-cooled electronic system, in accordance with an aspect of the present invention.

DETAILED DESCRIPTION OF THE INVENTION

Figure 1A:
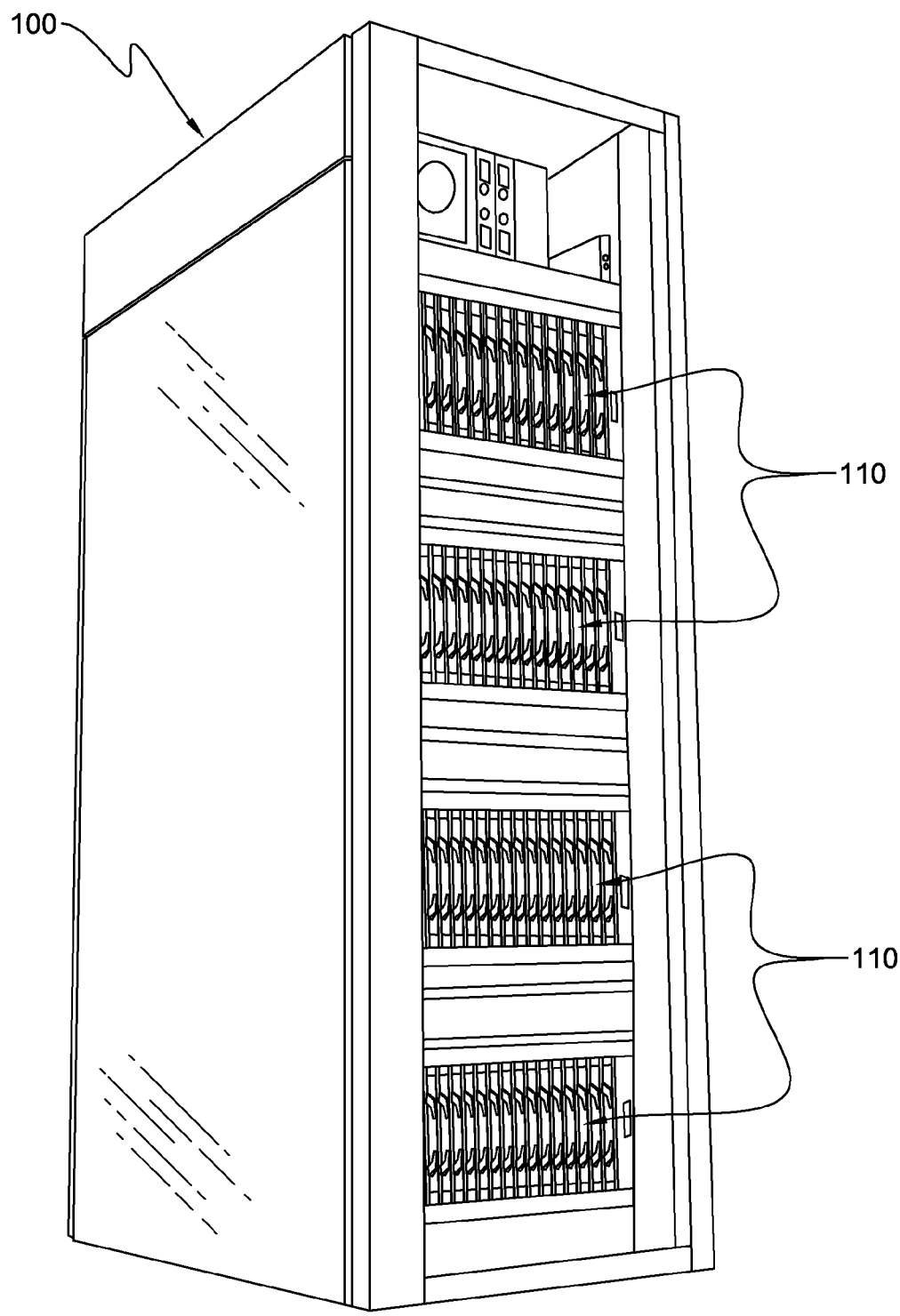
FIG. 1A depicts one embodiment of an electronics rack employing a stack of multiple-blade center systems having electronic systems to be immersion-cooled, in accordance with an aspect of the present invention.

As used herein, the term "electronics rack", includes any housing, frame, rack, compartment, blade server system, etc., having one or more heat generating components of a computer system, and may be, for example, a stand alone computer processor having high, mid or low end processing capability. In one embodiment, an electronics rack may comprise multiple electronic system chassis, each having multiple heat generating electronic systems or blades disposed therein requiring cooling. As one example, an electronic system chassis may be a multi-blade center system. The blades or electronic systems of each multi-blade center system may be removable, and comprise multiple different types of electronic components to be liquid-cooled. In one example, one or more blades of a multi-blade center system are immersion-cooled blades. "Immersion-cooled electronic system" or "immersion-cooled blade" refers to any system, blade, book, node, etc., having multiple different types of electronic components thereof directly cooled by common immersion within coolant flowing around, over, through or across the electronic components. In one instance, one or more surfaces of each electronic component of the multiple different types of electronic components is in direct physical contact with the coolant to facilitate transfer of heat from the electronic component to the coolant.

Examples of a liquid-cooled electronics rack employing immersion-cooled electronic systems are described in co-filed, commonly assigned U.S. patent applications entitled "Liquid Cooling Apparatus and Method for Cooling Blades of an Electronic System Chassis", Ser. No. 12/256,623, field Oct. 23, 2008, published on Apr. 29, 2010, as U.S. Patent Publication No.2010/0101765 A1, and "Apparatus and Method for Facilitating Pumped Immersion-Cooling of an Electronic Subsystem", Ser. No. 12/256,628, field Oct. 23, 2008, published on Apr. 29, 2010, as U.S. Patent Publication No. 2010/0103618 A1, while one detailed example of an immersion-cooled blade is described and depicted in co-filed, commonly assigned U.S. patent application entitled "Apparatus and Method for Facilitating Immersion-Cooling of an Electronics Subsystem", Ser. No. 12/256,618, filed Oct.23, 2008, published on Apr. 29, 2010, as U.S. Pat. Publication No. 2010/0101759 A1, the entirety of each of which is hereby incorporated herein by reference. Multiple components of an immersion-cooled electronic system may be directly immersion-cooled by the coolant or indirectly immersion-cooled.

Indirect immersion-cooling refers to the existence of a thermal cap, thermal spreader, passivation layer, or other surface interposed between one surface of the component and the coolant within which the component is immersed. In one instance, immersion of the component within the coolant means that the coolant flows over multiple surfaces of the component. For example, an upper main surface of an electronic component being immersion-cooled may be physically coupled to a thermal cap, thermal spreader, passivation layer, or other surface, while one or more sides of the electronic component are directly immersion-cooled by the coolant.

As a further example, an electronic system (or subsystem) may comprise a main circuit board (or motherboard) with a plurality of different types of discrete devices operatively connected thereto. A blade server for a multi-blade center system is one detailed example of an electronic system to be immersion-cooled.

As used herein, "heat exchanger" refers to any heat exchange assembly through which a first coolant and a second coolant can circulate. In one embodiment, the first coolant is a liquid coolant, and the second coolant is a two-phase dielectric coolant, which may undergo condensation within the heat exchanger. Size, configuration and construction of the heat exchanger can vary without departing from the scope of the invention disclosed herein.

One example of a liquid coolant flowing through the first coolant path is facility-chilled water, and one example of a two-phase coolant flowing through the second coolant path is a two-phase dielectric coolant. For example, the two-phase dielectric coolant may comprise a fluorocarbon or segregated hydrofluoroether liquid (e.g., FC-86, FC-87, FC-72, HFE-7000, HFE-7100, or HFE-7200, each of which is available from 3M Corporation, St. Paul, Minn., USA). Fluorocarbon liquid typically boils at 30° C.-80° C. at atmospheric pressure, while water boils at 100° C. Those skilled in the art should note, however, that the concepts disclosed herein are readily adapted to other types of first coolant and second coolant. For example, one or more of the coolants may comprise a brine, a liquid metal, or similar coolant, or a refrigerant, while still maintaining various advantages and unique features of the present invention.

Reference is made below to the drawings, which are not drawn to scale and are simplified for ease of understanding, and wherein the same reference numbers used throughout different figures designate the same or similar components.

FIG. 1A depicts one embodiment of an electronics rack 100 comprising a stack of electronic system chassis or multi-blade center systems 110, as well as supporting power supplies, networking equipment, etc.

Figure 1B:
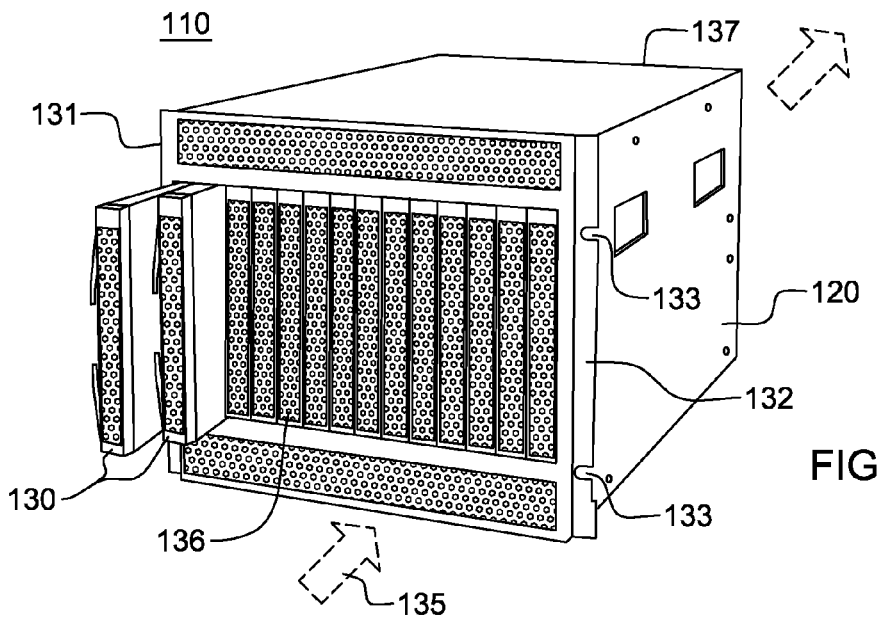
FIG. 1B is an isometric view of one embodiment of one multi-blade center system of the electronics rack of FIG. 1A.

FIG. 1B illustrates one embodiment of multi-blade center system 110, one example of which is marketed by International Business Machines Corporation, of Armonk, N.Y. By way of specific example, multi-blade center system 110 may comprise a stand alone server system which incorporates scalable computing functionality up to, for example, fourteen high performance servers (or blades).

As shown in FIG. 1B, multi-blade center system 110 includes a system chassis 120 and multiple removable blades 130. As one example, each removable blade 130 is an electronics system, such as a server of a multi-server electronics system. A first flange 131 and second flange 132 with openings 133 are also illustrated. Typically, flanges 131, 132 are used to secure the multi-blade center system within an electronics rack, such as depicted in FIG. 1A. Airflow 135 is conventionally provided through an air inlet side 136 of multi-blade center system 110 to an air outlet side 137, and is typically established, for example, by two or more air-moving devices (not shown) disposed at the back portion of the system housing. Electrical and networking infrastructure is also located near the back of system chassis 120.

Figure 1C:
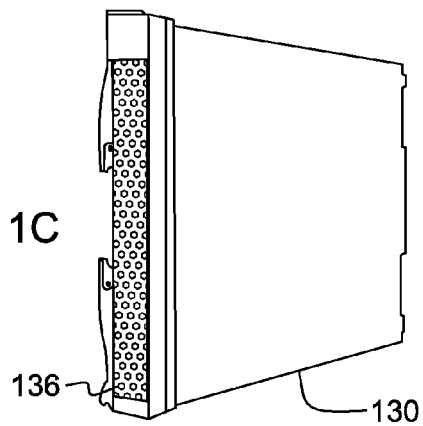
FIG. 1C is an isometric view of one embodiment of an individual removable blade of a multi-blade center system of FIG. 1B.
Figure 1D:
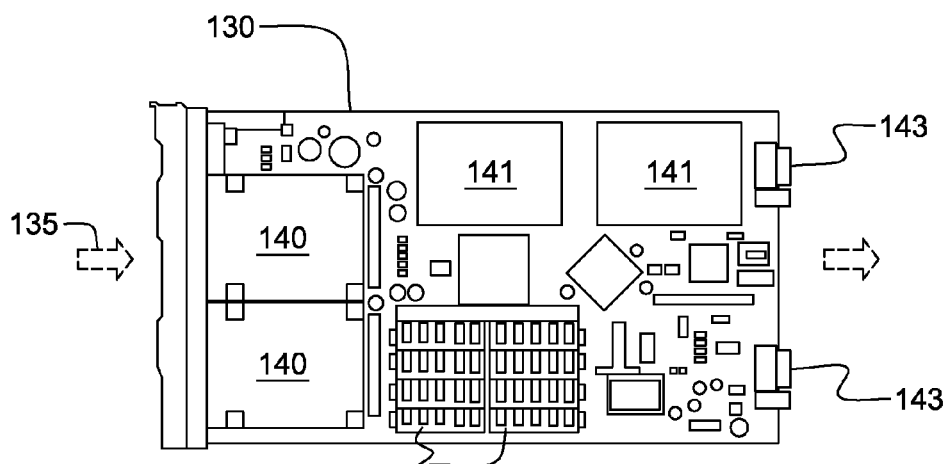
FIG. 1D is a side elevational view of one embodiment of the removable blade of FIG. 1C.

FIGS. 1C & 1D depict one embodiment of a removable blade 130 of the electronic system chassis. As illustrated in FIG. 1D, removable blade 130 includes, for example, multiple processors above which conventionally reside respective air-cooled heat sinks 140. In this example, each removable blade is a complete computer system, or subsystem, and includes, for example, Direct Access Storage Devices (DASDs) 141 and Dual In-Line Memory Modules (DIMMs) 142. Electrical connectors 143 are provided for electrically connecting blade 130 to the respective electronic system chassis 120 (FIG. 1B). Corresponding electrical connectors are disposed within the electronic system chassis near the back thereof for making electrical connection to connectors 143 when the blade is inserted into the chassis in operational position.

By way of specific example, a typical blade center chassis today is 9 U tall (where 1 U equals 1.75 inches or 44.45 mm) and houses 14 field-replaceable blades, each containing two central processing units (CPUs). A standard electronics rack that is 42 U tall can thus accommodate four such blade center chassis (each 9 U tall), for a total of 56 blades and 112 CPU modules. International Business Machines Corporation markets three versions of a blade center chassis, namely, the BC, BCH and BC-Telco versions. FIGS. 1A-1D illustrate one example of a BCH chassis marketed by International Business Machines Corporation, however, the concepts presented herein are readily applicable to any blade center chassis configuration, as well as to other electronic system housing variants. Further, the liquid cooling apparatus described herein is readily adaptable to use with any housing version with multiple electronic components to be immersion-cooled.

Advantageously, liquid cooling of a multi-blade center system, or an electronics rack such as depicted in FIG. 1A, provides increased cooling at the module and rack level, and enables higher performance systems than currently feasible using air-cooling. Further, a liquid cooling apparatus, such as described below, improves energy efficiency by eliminating or reducing requirements on one or more data center air-conditioning units; that is, by rejecting heat to liquid coolant, which in one example, is subsequently rejected to the ambient environment outside of the data center. With a liquid cooling approach such as described herein, the conventional air-moving devices within the multi-blade center systems and the electronics rack(s) are eliminated, thereby reducing acoustic noise within the data center. Additionally, a reduced form factor of the processor's thermal solution is provided, thus allowing more functionality to be packaged within a single system or blade. This added functionality could be memory, hard drives, or other devices, which would allow for a more competitive offering within the marketplace.

Co-pending U.S. patent application Ser. No. 12/168,259, filed Jul. 7, 2008, entitled "Liquid Cooling Apparatus and Method for Facilitating Cooling of an Electronic System", which is hereby incorporated herein by reference, discloses forced liquid cooling of selected components of one or more electronic system chassis. Disclosed hereinbelow, in part, is a pumped liquid cooling apparatus which achieves 100% liquid cooling of, for example, the blades of a multi-blade center system, whether as a stand alone system, or stacked within an electronics rack with other multi-blade center systems.

Figure 2:
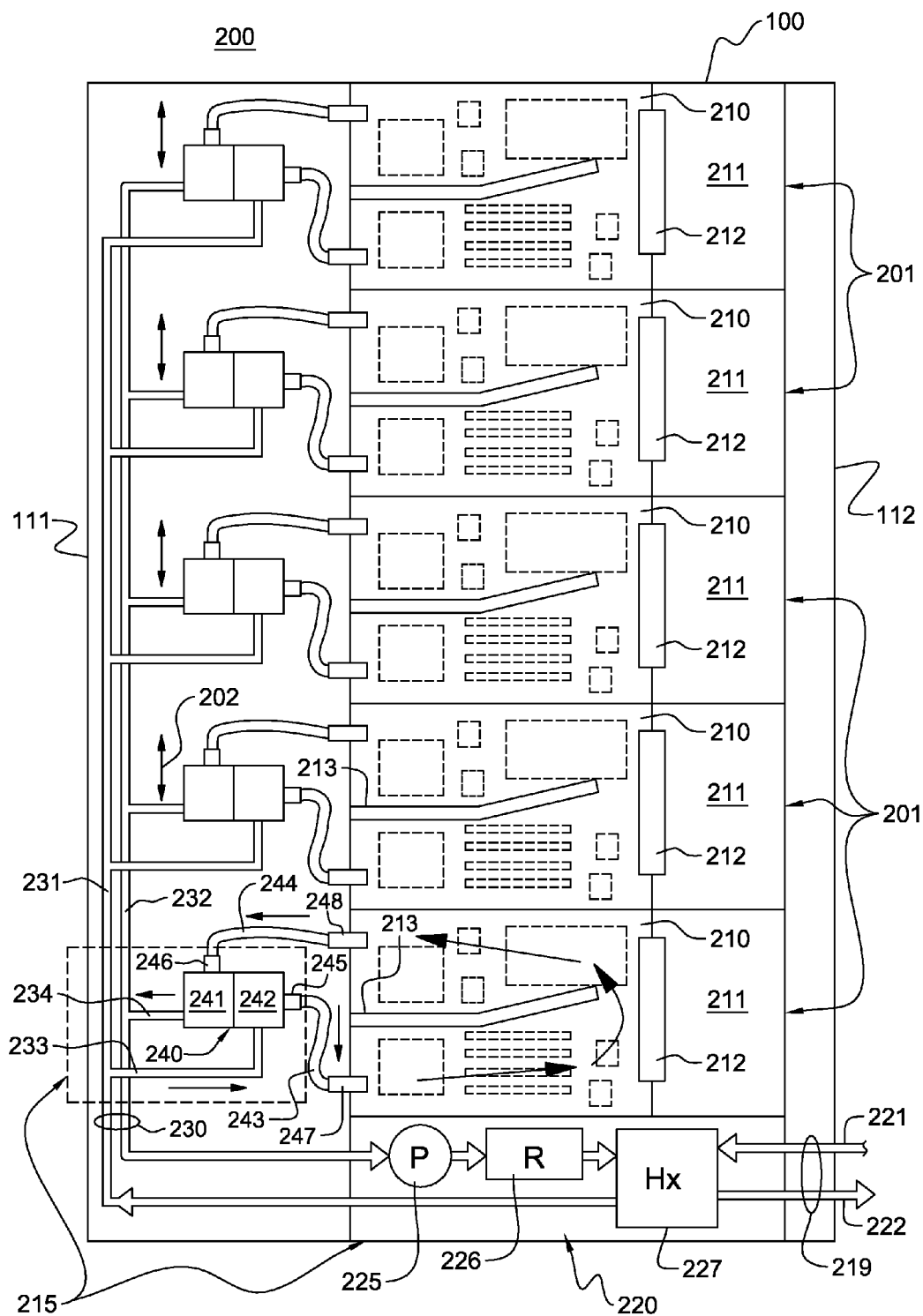
FIG. 2 is a schematic of one embodiment of a cooled electronics rack, comprising (in the illustrated embodiment) a stack of multi-blade center systems and an immersion-cooling apparatus, in accordance with an aspect of the present invention.

FIG. 2 is a schematic of one embodiment of a cooled electronics rack, generally denoted 200, in accordance with an aspect of the present invention. Cooled electronics rack 200 includes an electronics rack 100 having a plurality of multi-blade center systems 201 stacked within the rack. In this example, five multi-blade center systems 201 are illustrated, with each system being an example of an electronic system chassis. As illustrated in FIG. 2, each multi-blade center system 201 includes a back plane 212, into which respective removable immersion-cooled blades 210 are electrically, operatively inserted, and a back space 211 which conventionally would accommodate one or more air-moving devices (not shown) to cause airflow to flow from a front side 111 to a back side 112 of electronics rack 100 through the multi-blade center system 201.

One embodiment of an immersion-cooling apparatus, generally denoted 215, is illustrated in FIG. 2. In this embodiment, a rack-mounted, coolant conditioning unit 220 is disposed in a lower portion of electronics rack 100. Coolant conditioning unit 220 includes, in one example, a pump 225, a reservoir 226 and a heat exchanger 227 coupled in series fluid communication, as illustrated in FIG. 2. In this example, heat exchanger 227 is a liquid-to-liquid heat exchanger which extracts heat from coolant flowing through a first coolant loop 230 of immersion-cooling apparatus 215 and dissipates the heat to a facility coolant loop 219 comprising a facility coolant supply line 221 and facility coolant return line 222. In one example, facility coolant supply line 221 and facility coolant return line 222 couple coolant conditioning unit 220 to a data center facility coolant supply and return (not shown). Coolant conditioning unit 220 may further include an optional filter in fluid communication with first coolant loop 230.

In one embodiment, first coolant loop 230 includes a rack-level inlet manifold 231 and a rack-level outlet manifold 232, which are coupled to coolant conditioning unit 220 via, for example, flexible hoses and respective quick connect couplings. The flexible hoses allow the rack-level manifolds to be mounted within, for example, a door of the electronics rack which is hingedly mounted to the air inlet side of the rack in a manner similar to that described in co-pending, commonly assigned U.S. patent application Ser. No. 11/763,678, filed Jun. 15, 2007, entitled "Liquid-Based Cooling Apparatus for an Electronics Rack", the entirety of which is hereby incorporated herein by reference. In one example, rack-level inlet manifold 231 and rack-level outlet manifold 232 each comprise an elongated, rigid tube vertically mounted to electronics rack 100.

In the embodiment illustrated, the rack-level coolant manifold assembly, comprising rack-level inlet manifold 231 and rack-level outlet manifold 232, is in fluid communication with multiple movable chassis-level manifold assemblies 240. Various examples of movable chassis-level manifold assemblies mounted to an electronics rack are described in the above-incorporated, co-pending U.S. patent application Ser. No. 12/168,259, entitled "Liquid Cooling Apparatus and Method for Facilitating Cooling of an Electronics System". As illustrated in FIG. 2, each movable chassis-level manifold assembly is coupled to the electronics rack to reciprocate vertically (as indicated by arrows 202) adjacent to an associated electronic system chassis to facilitate the removal of individual blades, without impacting cooling of adjacent blades. Respective quick connect couplings may be employed to couple the rack-level inlet manifold and rack-level outlet manifold to each movable chassis-level manifold assembly 240, using for example appropriately sized, flexible rack-level tubing 233, 234. The quick connect couplings may be any one of various types of commercially available couplings, such as those available from Colder Products Company, of St. Paul, Minn., USA, or Parker Hannifin, of Cleveland, Ohio, USA.

Each movable chassis-level manifold assembly 240 includes a coolant return manifold 241 and a coolant supply manifold 242 disposed, in one example, within a common structure, but isolated to prevent direct flow of coolant therebetween. Heated coolant returning through coolant return manifold 241 of each chassis-level manifold assembly 240 is transferred via the rack-level outlet manifold 232 to coolant conditioning unit 220, where it is ultimately rejected to facility coolant loop 219. In one example, coolant passing through first coolant loop 230, and hence, coolant passing through the immersion-cooled blades is a two-phase dielectric coolant, such as described above. In the example illustrated, the vertically oriented rack-level inlet and outlet manifolds 231, 232 each have five ports, which connect to five horizontally oriented, movable chassis-level manifold assemblies 240 via respective coolant supply lines 233 and coolant return lines 234. The chassis-level manifold assemblies serve as coolant distribution and collection manifolds supplying and exhausting coolant in parallel to multiple immersion-cooled blades of a respective multi-blade center system 201.

Specifically, each coolant supply manifold 242 of each chassis-level manifold assembly 240 has a plurality of ports, each coupled via flexible tubing 243 to a coolant inlet of a different, respective immersion-cooled blade 210. In one embodiment, flexible tubing 243 couples to a respective supply port of the chassis-level manifold assembly 240 via an appropriate hose barb fitting 245, and couples to the immersion-cooled blade 210 via a quick connect coupling 247. Further, flexible tubing 244 couples a respective return port of a plurality of return ports of the chassis-level manifold assembly 240 to a coolant outlet of the respective immersion-cooled blade 210. At the outlet, a quick connect coupling 248 is employed (in one embodiment) to facilitate connection or disconnection of the corresponding immersion-cooled blade, while at the other end, flexible tubing 244 couples to a respective return port of chassis-level manifold assembly 240 via an appropriate hose barb fitting 246. Flexible tubes 243, 244 are sized and provided with sufficient flexibility to allow the associated movable chassis-level manifold assembly 240 to reciprocate within a designed extent of travel, as illustrated by arrows 202.

As noted, in one example, a two-phase dielectric coolant is employed within the immersion-cooled blades 210 and the immersion-cooling apparatus 215. In operation, flexible tubing 244 transports vaporized coolant from the respective immersion-cooled blade 210 to the coolant return manifold 241 of the respective chassis-level manifold assembly. From the respective coolant return manifold 241, the warm vapor-liquid dielectric mixture is returned via the rack-level outlet manifold 232 for forwarding to the rack-mounted, coolant conditioning unit 220 for subsequent cooling of the dielectric coolant. The process is continuously repeated in the operational mode, wherein coolant is actively pumped from the coolant conditioning unit 220 to the respective chassis-level manifold assemblies 240 for parallel distribution to the immersion-cooled blades 210 of the respective multi-blade center systems 201.

One or more surfaces of electronic components within the blade may be exposed directly (or indirectly) to the surrounding dielectric coolant, and heat transfer takes place via, for example, boiling at one or more surfaces of the different electronic components. In one embodiment, the liquid coolant, and resultant vapor, are directed via one or more centrally extending baffles or partitions 213 to an upper portion of the immersion-cooled blade 210, where the vapor rises to the top portion of the blade, and may be directed via one or more vapor deflectors (not shown) back to the outlet port for transport to the respective coolant return manifold, and hence to coolant conditioning unit 220 for condensing and cooling. Flow of the vapor-liquid mixture back to the coolant return manifolds of the respective chassis-level manifold assemblies 240 is facilitated by the active pumping of coolant through the immersion-cooled apparatus and immersion-cooled blades of the cooled electronics rack. The coolant conditioning unit 220 interfaces with the facility coolant loop 219, which in one embodiment, contains sub-ambient chilled water, and provides conditioned dielectric coolant to the supply rack manifold.

Figure 3A:
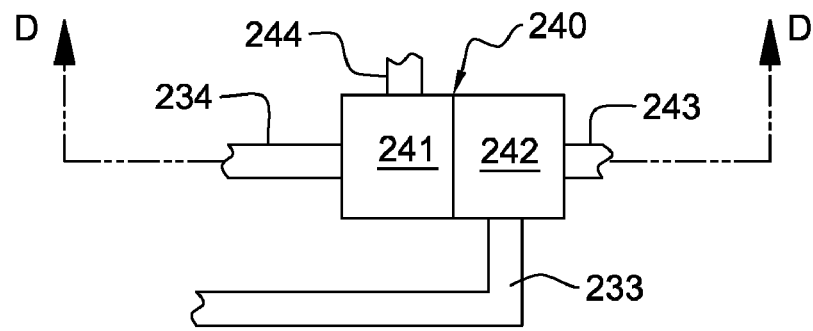
FIG. 3A is an elevational view of one embodiment of a chassis-level manifold assembly of the immersion-cooling apparatus of the cooled electronics rack of FIG. 2, in accordance with an aspect of the present invention.
Figure 3B:
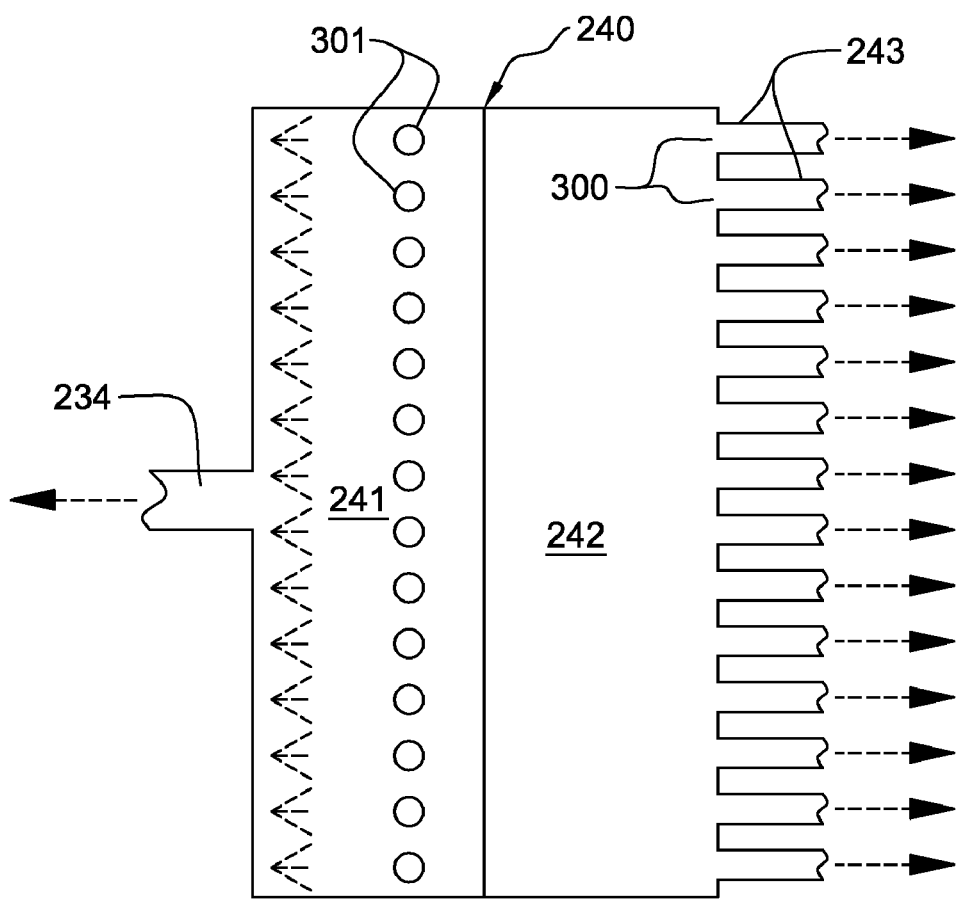
FIG. 3B is a cross-sectional plan view of the chassis-level manifold assembly of FIG. 3A, taken along line 3B-3B thereof, in accordance with an aspect of the present invention.

FIGS. 3A & 3B depict one embodiment of a chassis-level manifold assembly 240, in accordance with an aspect of the present invention. As illustrated in FIG. 3A, chassis-level manifold assembly 240 includes a coolant return manifold 241 and a coolant supply manifold 242, which are fluidically isolated by a wall within the assembly. A coolant supply line 233 couples coolant supply manifold 242 to the rack-level inlet manifold (see FIG. 2), and flexible tubing 243 couples each supply port of coolant supply manifold 242 to a respective immersion-cooled blade, as described above. In operation, cooled liquid dielectric coolant enters coolant supply manifold 242 of the chassis-level manifold assembly and is routed in parallel to the individual immersion-cooled blades via multiple supply ports 300 thereof in fluid communication with the immersion-cooled blades. The warm vapor-liquid coolant mixture is returned back to the coolant return manifold 241 via corresponding flexible hoses 244 coupled in fluid communication with respective return ports 301. The warm vapor-liquid coolant mixture is subsequently forwarded via coolant return line 234 to the rack-level outlet manifold (see FIG. 2). In one embodiment, the flexible hoses 244 possess quick disconnect couplings at the chassis-level manifold assembly and, for example, hose clamp connections at the immersion-cooled blade end.

Figure 4:
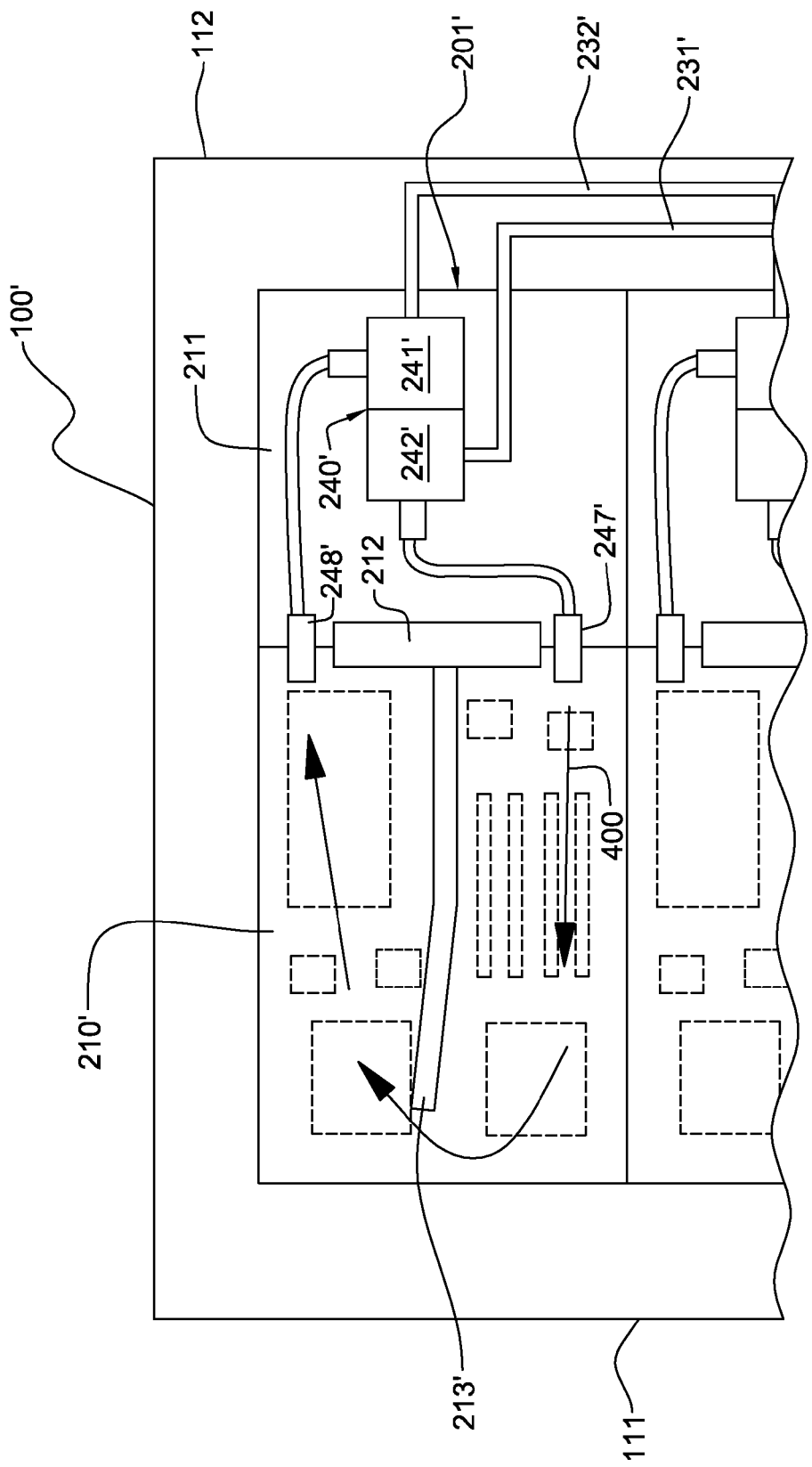
FIG. 4 is a partial elevational view of an alternate embodiment of a cooled electronics rack, comprising (in the illustrated embodiment) a stack of multi-blade center systems and an immersion-cooling apparatus, in accordance with an aspect of the present invention.

FIG. 4 depicts an alternate embodiment of a cooled electronics module, generally denoted 100', in accordance with an aspect of the present invention. In this embodiment, the rack-level inlet and outlet manifolds 231', 232' are repositioned from the front 111 of the cooled electronics rack (see FIG. 2) to the back 112 of the cooled electronics rack 100'. Additionally, the chassis-level manifold assemblies 240' are repositioned to space 211 at the back of the respective electronic system chassis. Blind mate quick connect couplings 247', 248' facilitate insertion of the immersion-cooled blades 210' into operative fluid communication with the respective coolant supply manifold 242' and coolant return manifold 241' of the chassis-level manifold assembly 240'. The blind mate quick connect couplings may comprise a pair of mating blind mate connectors that are disposed on the immersion-cooled blades, as well as within the electronic system chassis of the multi-blade center system 201'. Advantageously, the chassis-level manifold assembly 240' is readily accommodated within space 211 previously occupied by the conventional air-moving devices at the back portion of an air-cooled, multi-blade center system. Because of the positioning of the chassis-level manifold assemblies, either flexible or rigid tubing could be employed to connect each manifold assembly to the respective blind mate quick connect couplings 247', 248'. Also shown in this figure is a baffle 213' comprising a central portion of a filler element which (as described above) directs flow of coolant 400 over and around the multiple different types of electronic components of the electronic subsystem being immersion-cooled by the coolant.

FIGS. 5A-5K depict one embodiment of an apparatus 500 for facilitating cooling of an electronic system (or subsystem). Together, apparatus 500 and the electronic system define, in one example, an immersion-cooled blade 210 (see FIG. 2).

Figure 5A:
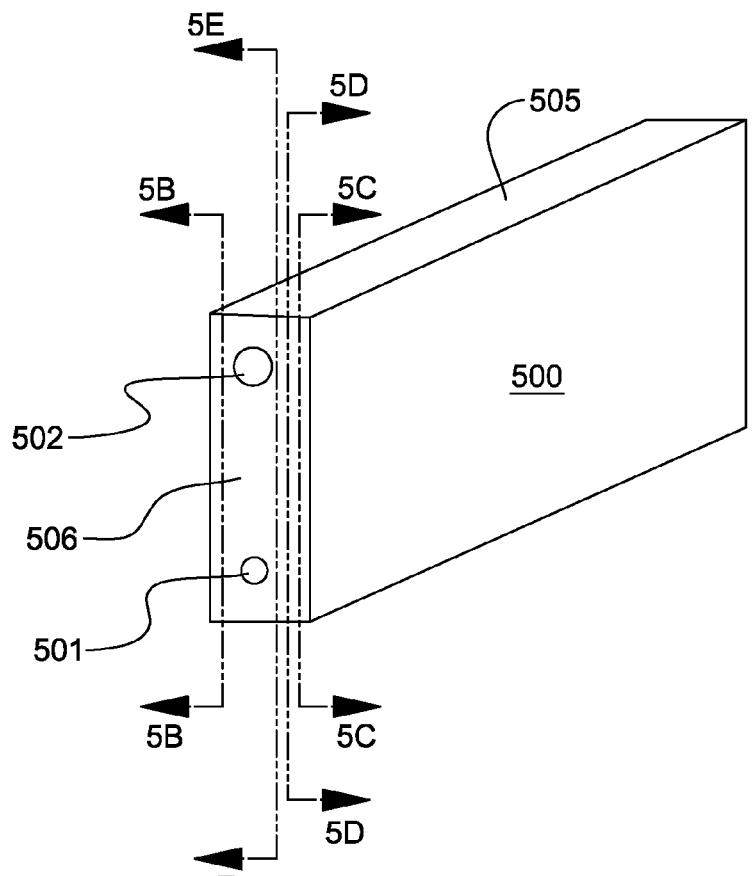
FIG. 5A is an isometric view of one embodiment of a container sized and configured to accommodate an electronic system therein for immersion-cooling of multiple different types of electronic components thereof, in accordance with an aspect of the present invention.
Figure 5B:
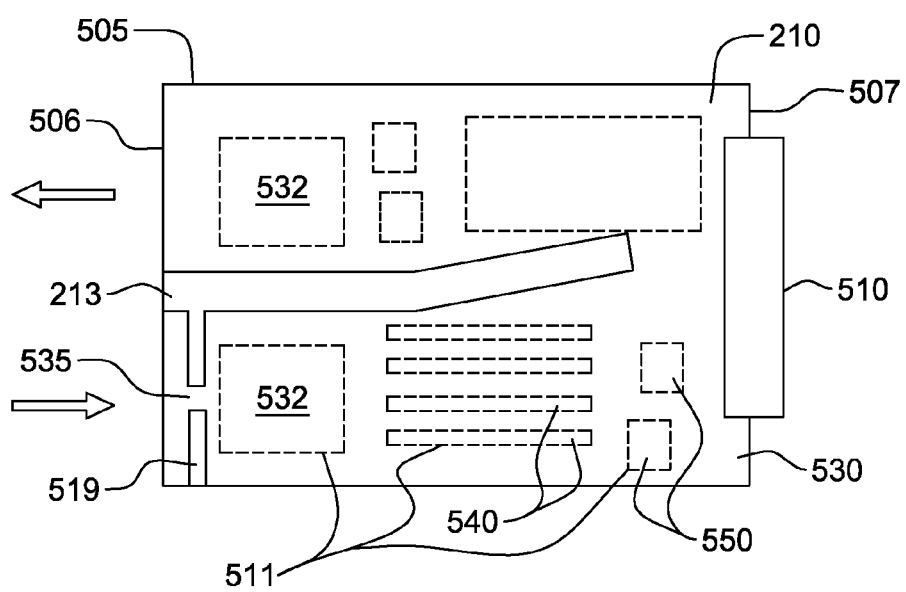
FIG. 5B is a cross-sectional elevational view of the assembly of FIG. 5A, taken along line 5B-5B thereof, in accordance with an aspect of the present invention.

Referring collectively to FIGS. 5A & 5B, apparatus 500 includes a hermetically sealable container 505, which in one embodiment is a polymeric container, designed to encapsulate an electronic system as an immersion-cooled blade 210. Container 505 includes an opening (not shown) to allow insertion or removal of the electronic system into (or from) the container. An appropriately sized and configured cover (not shown) seals to the container once the electronic system is operatively positioned therein. Hermetic sealing of the cover to the container could be achieved, for example, by epoxying the cover to the container once the electronic system is in operative position within the container. In one embodiment, container 505 is sized and configured for slidable, operative positioning within a docking area of a respective multi-blade center system. For example, the external surface of container 505 may be configured to mate with the internal structure of the blade-center chassis.

In the embodiment illustrated, container 505 is depicted (by way of example only) as a rectangular-shaped housing. A first container wall 506, for example, the front wall of container 505, includes a coolant inlet port 501 and a coolant outlet port 502 extending therethrough. The coolant inlet and outlet ports 501, 502, which are hermetically sealed to first container wall 506, respectively allow ingress and egress of coolant through the container. In the illustrated example, coolant outlet port 502 is larger than coolant inlet port 501 to accommodate exhausting of the warm vapor-liquid coolant mixture (i.e., in the two-phase coolant example). Container 505 also includes a hermetically sealed electrical connector 510 in a second container wall 507, for example, the back wall of the container. Hermetically sealed electrical connector 510 includes an internal electrical and network connection interface sized and configured to mate with the electrical and network connector disposed at one end of the electronic system to be immersion-cooled within the container. An external electrical and network connector projects beyond container 505 to facilitate external electrical and network coupling of the electronic system to, for example, back plane 212 (FIG. 2) of a corresponding electronic system chassis of one multi-blade center system within the cooled electronics rack.

Coolant inlet port 501 and coolant outlet port 502 are, in one embodiment, cylindrical-shaped, and may include hose barb fittings or NPT threaded internal or external portions to facilitate coupling thereof to a fluid hose or tube via, for example, hose clamp attachments or quick connect couplings. In one implementation, these inlet and outlet ports are inserted and then hermetically sealed into recesses within first container wall 506. Alternatively, the ports can be formed integral with the container body. The interiors of the coolant inlet and outlet ports may comprise cylindrical tubes.

On the opposing, second container wall 507, the internal electrical and network connection interface and external electrical and network connector of hermetically sealed electrical connector 510 are disposed to facilitate electrical and network communication functionality for the electronic system. These fittings are attached to container 505 in a hermetically sealed manner. The internal portion of the hermetically sealed container 510 is configured to couple to a complementary electrical and network connector of the electronic system to be immersion-cooled.

With the electronic system operatively positioned within container 505 and hermetically sealed therein, coolant ingresses and egresses through coolant inlet port 501 and coolant outlet port 502, respectively, extending from one wall of the container, and the external electrical and network connector portion of the hermetically sealed electrical connector 510 extends (in this example) from an opposing wall of the container. In the embodiment illustrated in FIG. 2, the immersion-cooled blades each have inlet and outlet ports located in a vertical plane at the front surface of the container. In practice, the immersion-cooled blades may be partially or totally filled with a dielectric coolant prior to installation of the blades into the electronic system chassis, and connecting of coolant lines to the two ports of the container.

As illustrated in FIGS. 2 & 5B, the lower coolant port receives cooled liquid dielectric coolant from the coolant supply manifold of the corresponding chassis-level manifold assembly, and the upper fluid port of the container exhausts a vapor-liquid mixture (in one example) to the coolant return manifold of the chassis-level manifold assembly. FIG. 5B illustrates a cross-sectional elevational view of immersion-cooled blade 210, wherein the electronic system being immersion-cooled is operatively positioned within container 505. As illustrated in FIG. 5B, the electronic system includes a main circuit board (or motherboard) 530 with multiple different types of electronic components 511 disposed thereon. These multiple different types of electronic components are immersion-cooled, in part, by a dielectric coolant wash flow passing through coolant inlet port 501 of container 505 and at least one wash flow orifice 535 in a wall structure 519. Baffle 213 is defined by a central partition of manifold structure 520, which as illustrated in FIGS. 5H-5K, contacts the main circuit board, and operates to preferentially direct coolant flow through the container across the multiple different types of electronic components 511 of the electronic system. The multiple different types of electronic components 511 comprise, in one example, processor modules 532, DIMMs 540 and DASDs 550.

The lower half of immersion-cooled blade 210 comprises a first half of the coolant wash flow path, and the top portion of immersion-cooled blade 210 comprises a second half of the coolant wash flow path. These two portions of the coolant wash flow path are separated, in the illustrated embodiment, by baffle 213. Once coolant enters the container, a portion of the coolant flow enters the coolant wash flow region via the at least one wash flow orifice 535, and the remaining portion of the coolant enters into a coolant jet plenum of the manifold structure, which is described below with reference to FIGS. 5C-5E.

Figure 5C:
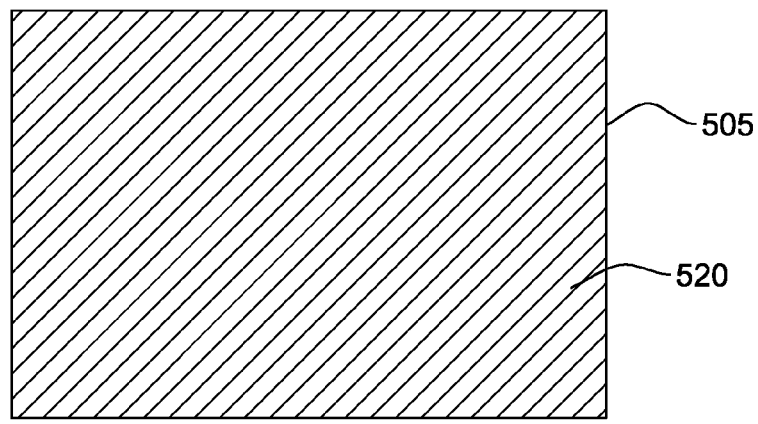
FIG. 5C is a cross-sectional elevational view of the assembly of FIG. 5A, taken along line 5C-5C thereof, in accordance with an aspect of the present invention.

Manifold structure 520 is sized and configured for disposition within container 505, and may comprise, in one embodiment, a molded structure or an inflatable structure. In the cross-sectional view of FIG. 5C, taken along line 5C-5C of FIG. 5A, manifold structure 520 is also shown to form or comprise, in part, a filler structure within container 505. Manifold structure 520 fills a desired portion of the container's internal space, thereby reducing an amount of coolant within the container at any time. Specifically, FIG. 5C illustrates that a certain portion of the volume of the container away from main circuit board is occupied by the filler structure. This volume would otherwise need to be filled by the expensive and heavy dielectric coolant. Advantageously, the manifold structure is thus sized to reduce the amount of coolant required within the container, while maintaining the multiple different types of electronic components of the electronic system immersion-cooled within the coolant. Further, in one embodiment, the manifold structure has a lower surface in opposing relation to the electronic system, which together define one or more coolant flow passages 560 (or channels) (see FIG. 5G) between the manifold structure and the multiple different types of electronic components being immersion-cooled by the coolant.

Figure 5D:
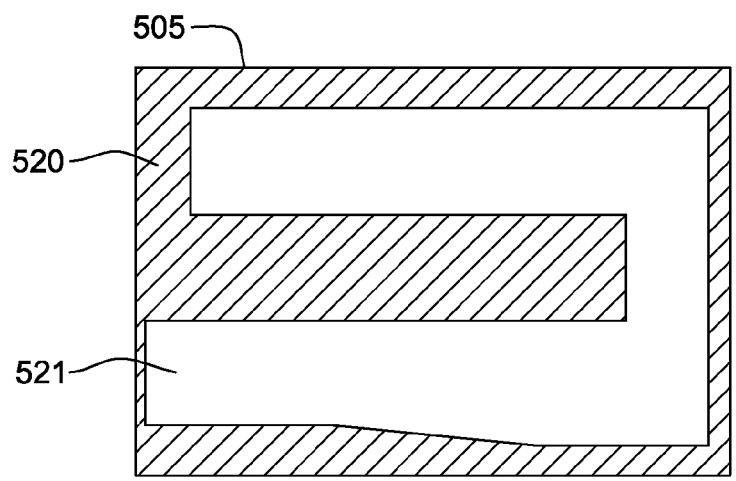
FIG. 5D is a cross-sectional elevational view of the assembly of FIG. 5A, taken along line 5D-5D thereof, in accordance with an aspect of the present invention.

FIG. 5D illustrates one embodiment of the coolant jet plenum 521 of manifold structure 520 disposed within container 505. Coolant jet plenum 521 is configured to facilitate provision of higher pressure jet flow impingement of coolant onto selected high heat-producing electronic components of the electronic system being immersion-cooled. The configuration and placement of coolant jet plenum 521 within manifold structure 520 may vary, depending upon the location of the higher heat-producing electronic components within the container.

Figure 5E:
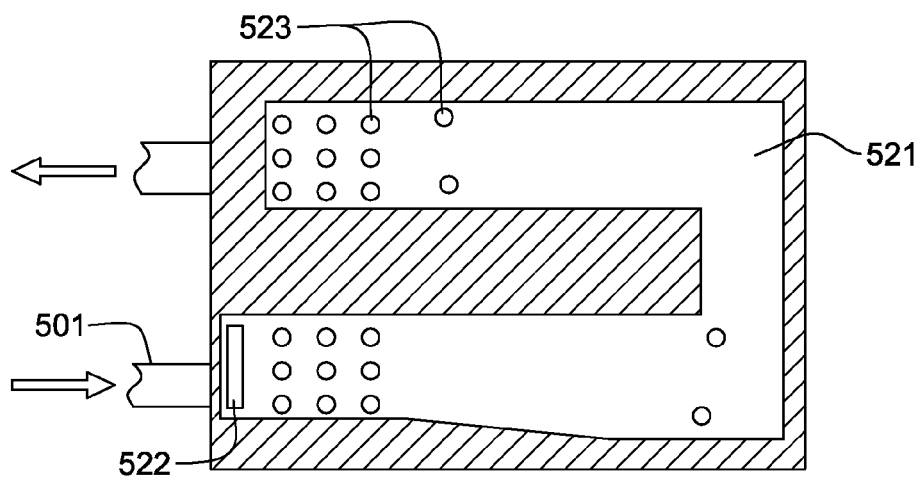
FIG. 5E is a cross-sectional elevational view of the assembly of FIGS. 5A-5D, taken along line 5E-5E of FIG. 5A, in accordance with an aspect of the present invention.

As illustrated in FIG. 5E, a plurality of jet orifices 523 are provided aligned over one or more electronic components of the electronic system to be immersion-cooled. In one embodiment, these jet orifices each provide jet impingement of coolant onto, for example, an exposed upper surface of a high heat-producing electronic component of the electronic system, such as a processor module. This coolant jet impingement onto selected components augments the coolant wash flow flowing around and over the multiple different types of electronic components of the immersion-cooled electronic system. The number and location of jet orifices may vary within the manifold structure, as required to provide enhanced cooling for a particular electronic system configuration. In the embodiment illustrated, multiple jet orifices are illustrated aligned to processor modules 532 (see FIG. 5B), as well as other higher powered components, such as DASDs 550 of the electronic system embodiment of FIG. 5B. Also illustrated in FIG. 5E is an inlet opening 522 in fluid communication with coolant jet plenum 521 for directing at least a portion of coolant ingressing through coolant inlet port 501 into coolant jet plenum 521.

Figure 5F:
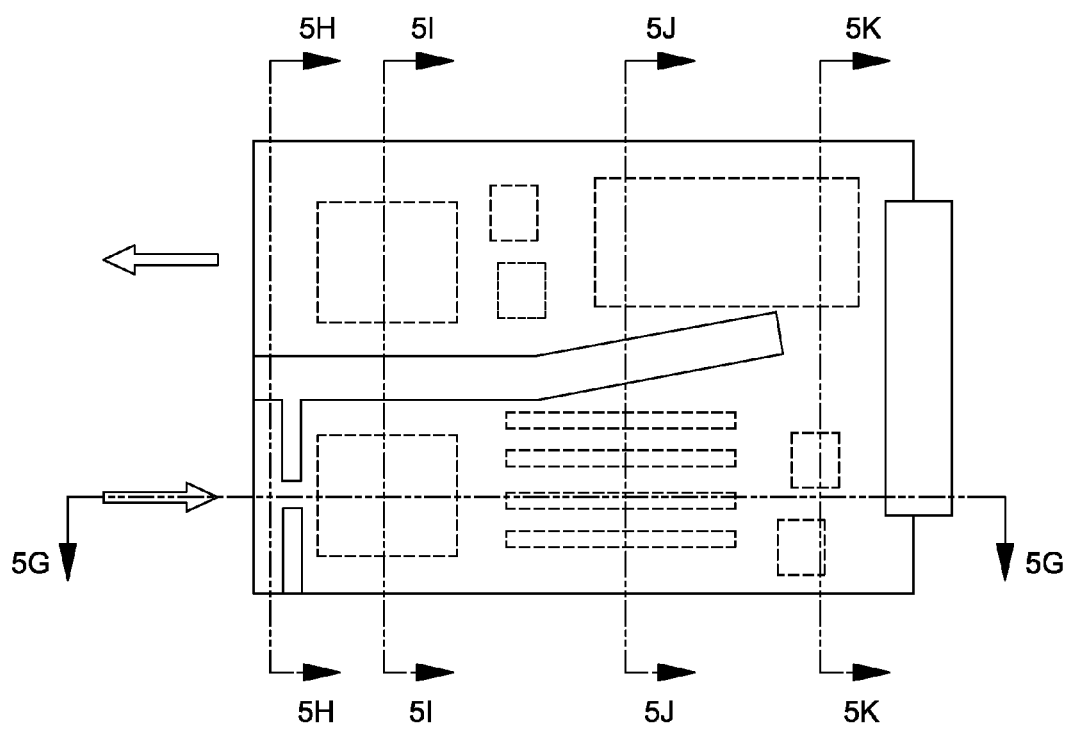
FIG. 5F is a cross-sectional elevational view of the assembly of FIGS. 5A-5E, taken along line 5B-5B of FIG. 5A, in accordance with an aspect of the present invention.

FIG. 5F illustrates the cross-sectional view of FIG. 5B, with the addition of further cross-sectional lines through the assembly. These cross-sectional lines denote the cross-sectional views for FIGS. 5G-5K of the assembly.

In FIG. 5G, coolant (for example, a two-phase dielectric coolant) received through coolant inlet port 501 in container 505 is partitioned by manifold structure 520, with a portion of the coolant flow passing through one or more wash flow orifices 535 in a wall structure 519 of manifold structure 520, and another portion of the coolant flow passing through inlet opening 522 into coolant jet plenum 521 of manifold structure 520. Coolant passing through wash flow orifice 535 forms the lower pressure coolant wash flow passing through the coolant flow passage 560 defined between manifold structure 520 and the electronic system comprising the multiple different types of electronic components being immersion-cooled.

As illustrated, a plurality of jet orifices 523 are aligned over processor module(s) 532 for jet impingement of coolant onto an upper surface of the processor module. Coolant wash flow is diverted (in one embodiment) around processor module 532 via one or more jet protection shields 525 disposed at one or more sides of processor module 532. Jet protection shields 525 may be disposed adjacent to selected electronic components being cooled by jet impingement of coolant to serve to divert coolant wash flow around the selected electronic components to facilitate jet impingement of coolant onto those components. In one embodiment, the jet impingement shield is a C-shaped structure, as viewed in a plan view (see FIG. 6B). Further, in one embodiment, the C-shaped structure extends downward from the manifold structure, as illustrated in FIG. 5G. The open part of the C-shaped shield allows the exhaust effluent from the jet impingement flow to joint the coolant wash flow through the coolant flow passage 560. In addition to the plurality of jet orifices 523 in the manifold structure, one or more larger jet nozzles 524 may be provided to cool different high heat flux electronic components of the electronic system.

FIGS. 5H-5K illustrate several sectional elevational views rotated 90 degrees from the cross-sectional view of FIG. 5G. In FIG. 5H, the inlet and outlet cavities into which and from which coolant enters and leaves the container are illustrated. Specifically, wash flow orifice 535 is in fluid communication with the coolant inlet port (not shown), as is inlet opening 522 to coolant jet plenum 521 of manifold structure 520. The lower pressure coolant flow passing through wash flow orifice 535 is preferentially directed by central baffle 213 through a coolant flow passage 560, defined between manifold structure 520 and the electronic system being immersion-cooled. Also illustrated in this figure is jet protection shield 525 disposed along one or more sides of processor module 532, which as noted above, facilitates jet impingement of coolant onto the processor module by diverting the coolant wash flow around the processor module. The filler structure aspect of manifold structure 520 is also illustrated in FIG. 5H.

FIG. 5I illustrates jet orifices 523 disposed over respective processor modules 532 for enhanced cooling the processor modules using jet impingement of coolant onto, for example, an upper surface of each processor module. This figure also illustrates coolant jet plenum 521 being disposed on both sides of manifold structure 520 within container 505. As noted, jet protection shields 525 divert coolant wash flow flowing through coolant flow passage 560 around processor modules 532 to facilitate jet impingement cooling of the processor modules.

Figure 5J:
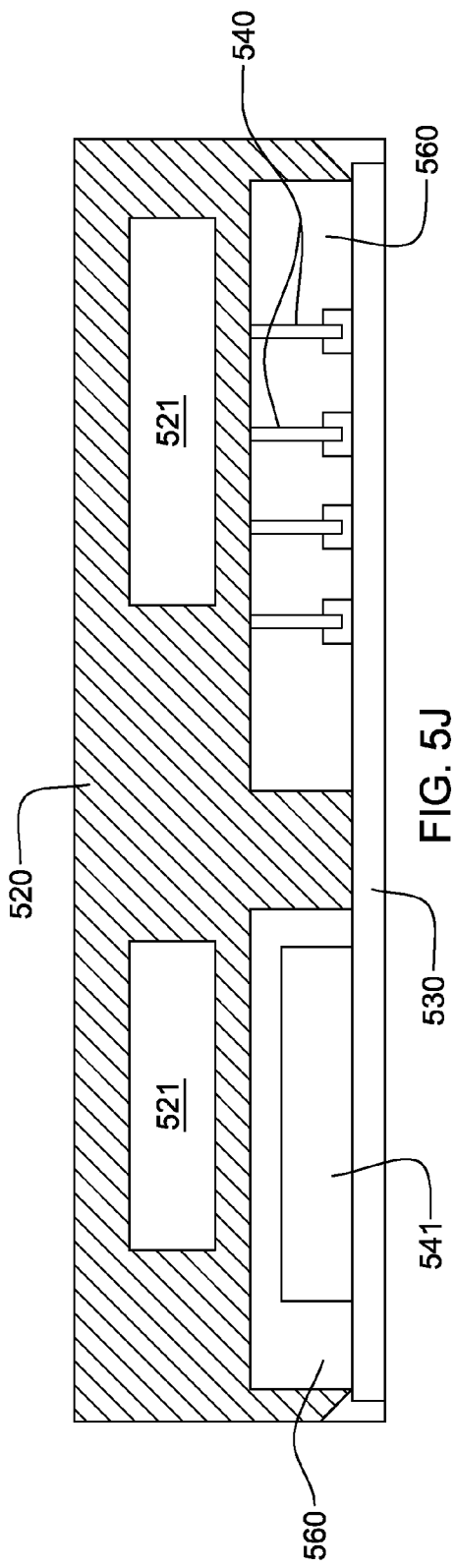
FIG. 5J is a cross-sectional elevational view of the assembly of FIGS. 5A-5I, taken along line 5J-5J of FIG. 5F, in accordance with an aspect of the present invention.

In FIG. 5J, coolant flow passage 560 is again illustrated. Coolant wash flow passing through coolant flow passage 560 cools, for example, DIMMs 540 and other lower power components 541 disposed on main circuit board 530 of the electronic system. Also illustrated in FIG. 5J are the two different coolant flow paths, that is, the coolant flow passage 560 and the coolant jet plenum 521 within manifold structure 520. In this view, each coolant path is separated by a thickness of the filler material of manifold structure 520.

Figure 5K:
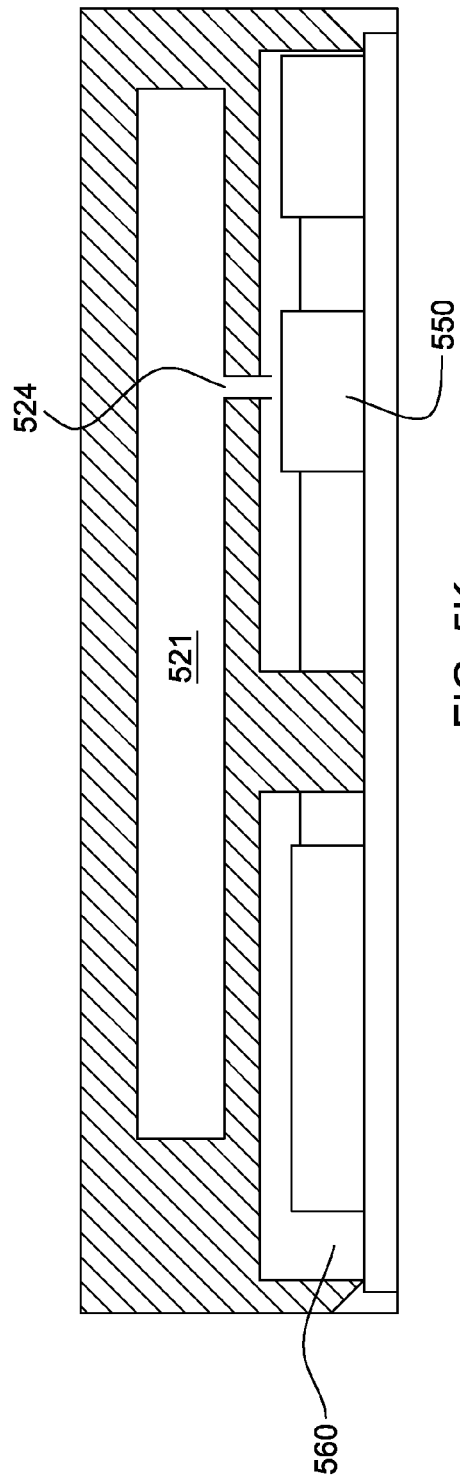
FIG. 5K is a cross-sectional elevational view of the assembly of FIGS. 5A-5J, taken along line 5K-5K of FIG. 5F, in accordance with an aspect of the present invention.

FIG. 5K illustrates a jet nozzle 524 in fluid communication with coolant jet plenum 521 for providing coolant to cool a higher heat flux electronic component, such as DASD 550 of FIG. 5B. Also illustrated in FIG. 5K is the interconnection of the different portions of the coolant jet plenum illustrated, for example, in FIGS. 5I & 5J. Coolant flow passage 560, through which the coolant wash flow passes, is also depicted.

FIGS. 6A-6C illustrate several perspective views of one embodiment of a manifold structure 520, in accordance with an aspect of the present invention. As illustrated, manifold structure 520 may comprise a main filler structure 600 and a manifold cap 610, which seals to define the coolant jet plenum. Main filler structure 600 is a main structure which could be fabricated, for example, by machining, injection molding or casting. As shown in FIG. 6B, main filler structure 600 is configured (in one embodiment) with a centrally-disposed flow partitioner or baffle 213, as well as an inlet opening 522 and a wash flow orifice 535 in a wall structure 519 positioned to divide coolant flow between the coolant jet plenum and the coolant flow passage. One embodiment of jet protection shield 525 is also shown disposed around a plurality of jet orifices 523 positioned to align over, for example, the processor modules of the electronic system being immersion-cooled. Arrows 601 illustrate the direction of coolant wash flow through the coolant flow passage defined between main filler structure 600 and the electronic system when operatively positioned within the container of the apparatus. FIG. 6C illustrates main filler structure 600, as viewed from the coolant jet plenum side, and without the manifold cap 610 of FIGS. 6A & 6B in position. As illustrated, a portion of the coolant inlet flow passes through inlet opening 522 into coolant jet plenum 521, and subsequently, through jet orifices 523. Arrows 611 illustrate the general flow of coolant within the coolant jet plenum.

Figure 7:
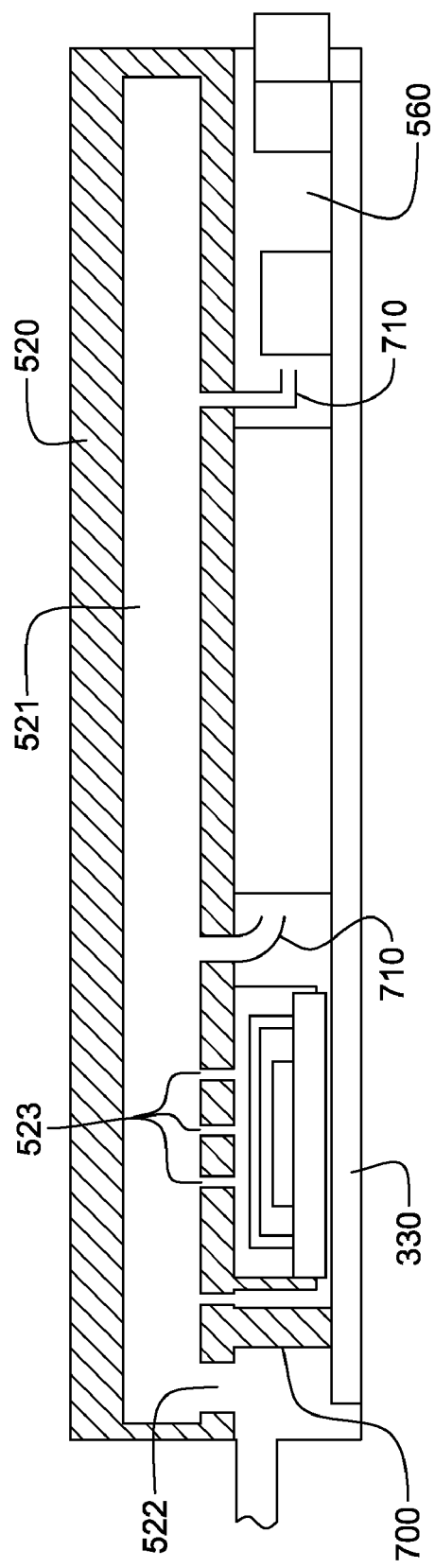
FIG. 7 is a cross-sectional elevational view of an alternate embodiment of an assembly comprising a container, a manifold structure and an immersion-cooled electronic system comprising multiple different types of electronic components being immersion-cooled, in accordance with an aspect of the present invention.

FIG. 7 depicts an alternate embodiment of an apparatus and electronic system assembly to that depicted in FIG. 5G. In this embodiment, the manifold structure has a solid wall 700 positioned to direct all ingressing coolant through inlet opening 522 into coolant jet plenum 521. There is no wash flow orifice in this embodiment. The coolant flow enters the immersion-cooling regions either via jet orifices 523 or via nozzles 710. Nozzles 710 are positioned for distributing coolant for immersion-cooling of lower heat-generating electronic components of the electronic system. In one implementation, these jet nozzles 710 are spaced from the electronic components to be immersion-cooled, and some of the electronic components of the electronic system may be cooled by exhaust flow from the jet impingement cooling regions beneath the plurality of jet orifices.

FIGS. 8A & 8B depict a further variation on the cooling apparatus and electronic system assemblies of FIGS. 5G & 7, respectively. In FIG. 8A, the assembly of FIG. 5G is illustrated, with the addition of a submerged pump 800 disposed within coolant jet plenum 521 to augment the pressure of the coolant within the coolant jet plenum. This augmented pressure results in a higher velocity jet impingement of coolant onto the selected high heat-generating electronic components than would otherwise be possible. FIG. 8B illustrates the assembly of FIG. 7, again with the addition of a submerged pump 801 within the container, either within or in fluid communication with, coolant jet plenum 521.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronic system, the apparatus comprising:

a container sized to receive an electronic system therein, the electronic system comprising multiple different types of electronic components;

a coolant inlet port and a coolant outlet port associated with the container for facilitating ingress and egress of coolant through the container, wherein the container comprises a wash flow opening in fluid communication with the coolant inlet port for passing a portion of coolant ingressing therethrough through the container as a coolant wash flow, and wherein when the electronic system is operatively positioned within the container and coolant flows therethrough, different types of electronic components of the electronic system are immersion-cooled by the coolant wash flow passing thereacross; and a manifold structure associated with the container, the manifold structure comprising a coolant jet plenum with an inlet opening in fluid communication with the coolant inlet port for receiving a portion of coolant ingressing therethrough, and at least one jet flow orifice in fluid communication with the coolant jet plenum, the at least one jet flow orifice being positioned to facilitate jet flow cooling of at least one electronic component of the electronic system by jet impingement of coolant thereon when the electronic system is operatively positioned within the container.

2. The apparatus of claim 1, wherein the manifold structure is positioned within the container and is sized and configured to create a coolant flow passage between the electronic system and at least one surface of the manifold structure when the electronic system is operatively positioned within the container.

3. The apparatus of claim 2, further comprising a wall structure within the container, the wall structure comprising the wash flow opening in fluid communication with the coolant inlet port for receiving a portion of the coolant ingressing therethrough, the wash flow opening being configured to provide a lower pressure coolant stream within the container, the lower pressure coolant stream being at least a portion of the coolant wash flow through the coolant flow passage.

4. The apparatus of claim 3, wherein the wash flow opening is defined by a nozzle in fluid communication with the coolant jet plenum and is sized and configured to facilitate coolant wash flow cooling of the multiple different types of electronic components of the electronic system.

5. The apparatus of claim 2, further comprising a jet protection shield disposed within the container adjacent to the at least one electronic component cooled by jet impingement of coolant thereon when the electronic system is operatively disposed within the container and coolant flows therethrough, the jet protection shield being configured to direct at least a portion of the coolant wash flow around the at least one electronic component to facilitate jet impingement of coolant onto the at least one electronic component of the electronic system being immersion-cooled.

6. The apparatus of claim 1, wherein the manifold structure comprises a plurality of jet orifices positioned to facilitate cooling of multiple electronic components of the electronic system by jet impingement of coolant thereon when the electronic system is operatively disposed within the container and coolant flows therethrough, the multiple electronic components comprising higher heat-producing components of the multiple different types of electronic components being immersion-cooled.

7. The apparatus of claim 1, further comprising a submerged coolant pump disposed within the container to enhance coolant pressure within the coolant jet plenum.

8. The apparatus of claim 1, wherein the manifold structure comprises, in part, a filler structure configured to direct the coolant wash flow through the container, while maintaining the multiple different types of electronic components of the electronic system immersion-cooled by the coolant when the electronic system is operatively disposed within the container and coolant flows therethrough, the filler sturcture comprising a centrally-disposed flow partitioner directing the coolant wash flow through the container, and wherein the apparatus further comprises a coolant pump assembly external to the container and coupled in fluid communication with the coolant inlet port and the coolant outlet port for facilitating active pumping of coolant through the container, thereby providing pumped, immersion-cooling of the electronic system when the electronic system is operatively disposed within the container.

9. A cooled electronics rack comprising:
an electronics rack at least partially surrounding and supporting at least one electronic system chassis, the at least one electronic system chassis comprising at least one electronic system, each electronic system comprising multiple different types of electronic components; and
at least one apparatus for facilitating cooling of the at least one electronic system, each apparatus of the at least one apparatus comprising:
a container sized to accommodate therein a respective electronic system of the at least one electronic system;
a coolant inlet port and a coolant outlet port associated with the container for facilitating ingress and egress of coolant through the container, the container comprises a wash flow opening in fluid communication with the coolant inlet port for passing a portion of coolant ingressing therethrough through the container as a coolant wash flow, wherein when coolant flows through the container, different types of electronic components of the electronic system disposed therein are immersion-cooled by the coolant wash flow passing thereacross; and
a manifold structure disposed within the container, the manifold structure comprising a coolant jet plenum with an inlet opening in fluid communication with the coolant inlet port for receiving a portion of the coolant ingressing therethrough, and a plurality of jet flow orifices in fluid communication with the coolant jet plenum, the plurality of jet flow orifices being positioned to facilitate jet flow cooling of at least one electronic component of the electronic system by jet impingement of coolant thereon when coolant flows through the container.

10. The cooled electronics rack of claim 9, further comprising a coolant pump assembly coupled in fluid communication with the coolant inlet port and the coolant output port of each container for facilitating active pumping of coolant through each container to provide immersion-cooling of the respective electronic system disposed therein, and wherein the at least one apparatus is sized and configured for operative insertion into the at least one electronic system chassis, and the cooled electronics rack further comprises at least one chassis-level manifold assembly comprising a coolant supply manifold and a coolant return manifold coupled in fluid communication with the coolant inlet port and the coolant outlet port, respectively, of the at least one apparatus.

11. The cooled electronics rack of claim 10, wherein each electronic system chassis of the at least one electronic system chassis comprises multiple electronic systems, and wherein the cooled electronics rack comprises multiple apparatuses for facilitating cooling of the multiple electronic systems, and the coolant supply manifold of the chassis-level manifold assembly comprises multiple supply ports, each supply port being coupled in fluid communication with a respective coolant inlet port of a respective container of the multiple apparatuses, and wherein the coolant return manifold comprises multiple return ports, each return port being coupled in fluid communication with a respective coolant outlet port of a respective container of the multiple apparatuses, wherein the coolant supply manifold facilitates supply of coolant in parallel to the multiple containers and the coolant return manifold facilitates return of coolant in parallel from the multiple containers.

12. The cooled electronics rack of claim 9, wherein the manifold structure of each apparatus is sized and configured to create a coolant flow passage through which the coolant wash flows between the respective electronic system disposed therein and at least one surface of the manifold structure.

13. The cooled electronics rack of claim 12, wherein each apparatus further comprises a wall structure within the container, the wall structure comprising the wash flow opening in fluid communication with the coolant inlet port of the container for receiving a portion of the coolant ingressing therethrough, the wash flow opening being configured to provide a lower pressure coolant stream within the container, the lower pressure coolant stream being at least a portion of the coolant wash flow through the coolant flow passage.

14. The cooled electronics rack of claim 12, wherein each apparatus further comprises a jet protection shield disposed within the container adjacent to the at least one electronic component cooled by jet impingement of coolant thereon when coolant flows through the container, the jet impingement shield being configured to divert at least a portion of the coolant wash flow around the at least one electronic component to facilitate jet impingement of coolant onto the at least one electronic component of the electronic system being immersion-cooled.

15. The cooled electronics rack of claim 9, wherein the manifold structure of each apparatus comprises a filler structure configured to direct the coolant wash flow through the container, while maintaining the multiple different types of electronic components of the electronic system immersion-cooled by the coolant when coolant flows through the container, the filler structure comprising a centrally-disposed flow partitioner directing coolant wash flow through the container, and wherein the filler structure is sized, in part, to reduce an amount of coolant within the container when coolant flows therethrough.

16. A method of facilitating cooling of an electronic system, the method comprising:
 providing a container sized to receive an electronic system therein, and a coolant inlet port and a coolant outlet port associated with the container for facilitating ingress and egress of coolant through the container, the container further including a wash flow opening in fluid communication with the coolant inlet port for passing a portion of coolant ingressing therethrough through the container as a coolant wash flow, and the electronic system comprising multiple different types of electronic components to be immersion-cooled, wherein when the electronic system is operatively positioned within the container and coolant flows therethrough, different types of electronic components of the electronic system are immersion-cooled by the coolant wash flow passing thereacross; and
 providing a manifold structure disposed within the container, the manifold structure comprising a coolant jet plenum with an inlet opening in fluid communication with the coolant inlet port for receiving at least a portion of the coolant ingressing therethrough, and a plurality of jet flow orifices in fluid communication with the coolant jet plenum, the plurality of jet flow orifices being positioned to facilitate jet flow cooling of at least one electronic component of the electronic system by jet impingement of coolant thereon when the electronic system is operatively positioned within the container.

17. The method of claim 16, further comprising operatively disposing the electronic system within the container, and coupling a coolant pump assembly in fluid communication with the coolant inlet portion and the coolant outlet port to facilitate active pumping of coolant through the container to provide pumped immersion-cooling of the multiple different types of electronic components of the electronic subsystem.

18. The method of claim 16, wherein providing the manifold structure further comprises sizing and configuring the manifold structure to create a coolant flow passage through which the coolant wash flows between the electronic system and at least one surface of the manifold structure when the electronic system is operatively positioned within the container.

19. The method of claim 18, further comprising providing a wall structure within the container, the wall structure comprising the wash flow opening in fluid communication with the coolant inlet port for passing a portion of the coolant ingressing therethrough, the wash flow opening being configured to provide a lower pressure coolant stream within the container, the lower pressure coolant stream being at least a portion of the coolant wash flow through the coolant flow passage.

20. The method of claim 16, wherein providing the manifold structure comprises providing the manifold structure with a configuration to direct the coolant wash flow through the container, while maintaining the multiple different types of electronic components of the electronic system immersion-cooled by the coolant, the manifold structure comprising a filler structure with a centrally-disposed flow partitioner directing coolant wash flow through the container, wherein different electronic components of the electronic system are immersion-cooled by coolant jet impingement or coolant wash flow.

* * * * *